United States Patent
Kennon et al.

(10) Patent No.: US 7,925,482 B2
(45) Date of Patent: Apr. 12, 2011

(54) METHOD AND SYSTEM FOR MODELING AND PREDICTING HYDRAULIC FRACTURE PERFORMANCE IN HYDROCARBON RESERVOIRS

(75) Inventors: Stephen R. Kennon, Austin, TX (US); Scott A. Canann, Austin, TX (US); Steven B. Ward, Austin, TX (US); Frank Joseph Eaton, Austin, TX (US)

(73) Assignee: Object Reservoir, Inc., Austin, TX (US)

( * ) Notice: Subject to any disclaimer, the term of this patent is extended or adjusted under 35 U.S.C. 154(b) by 803 days.

(21) Appl. No.: 11/855,741

(22) Filed: Sep. 14, 2007

(65) Prior Publication Data

US 2008/0091396 A1 Apr. 17, 2008

Related U.S. Application Data

(60) Provisional application No. 60/851,465, filed on Oct. 13, 2006, provisional application No. 60/854,381, filed on Oct. 25, 2006.

(51) Int. Cl.
*G06G 7/48* (2006.01)
(52) U.S. Cl. .................. 703/10; 702/11; 367/72
(58) Field of Classification Search .......... 703/10
See application file for complete search history.

(56) References Cited

U.S. PATENT DOCUMENTS

| | | | | |
|---|---|---|---|---|
| 6,018,497 | A * | 1/2000 | Gunasekera | 367/72 |
| 6,023,656 | A * | 2/2000 | Cacas et al. | 702/12 |
| 6,842,725 | B1 * | 1/2005 | Sarda | 703/10 |
| 6,876,959 | B1 * | 4/2005 | Peirce et al. | 703/10 |
| 7,509,245 | B2 * | 3/2009 | Siebrits et al. | 703/10 |
| 7,565,277 | B2 * | 7/2009 | Basquet et al. | 703/10 |
| 7,634,395 | B2 * | 12/2009 | Flandrin et al. | 703/10 |
| 2006/0015310 | A1 * | 1/2006 | Husen et al. | 703/10 |

OTHER PUBLICATIONS

Kaselow et al, "Modeling of Stress-Dependent Hydraulic Fracturing in a Dynamic Flow Simulation", SPE 100226, SPE Europe/EAGE Annual Conference and Exhibition, Vienna, Austria, Jun. 12-15, 2006.*
Sarda et al, "Hydraulic Characterization of Fractured Reservoirs: Simulation on Discrete Fracture Models", SPE 66398, SPE Reservoir Simulation Symposium, Houston, Texas, Feb. 11-14, 2001.*
Riley, Michael, "Finite Conductivity Fractures in Elliptical Coordinates", Dissertation, Stanford University, Jun. 1991.*
Kochberber, S., "An Automatic, Unstructured Grid-Generation System for Geologically Complex Reservoirs", SPE Computer Applications, Oct. 1995.*
Karimi-Fard et al, "Numerical Simulation of Water Injection in Fractured Media Using the Discrete-Fracture Model and the Galerkin Method", SPE Reservoir Evaluation & Engineering, Apr. 2003.*
Reichenberger et al, "A Mixed-Dimensional Finite Volume Method for Two-Phase Flow in Fractured Porous Media", Advances in Water Resources 29, pp. 1020-1036, 2006, available online Oct. 25, 2005.*
Kroemer et al, "Compositional Simulation of Well Performance for Fractured and Multiple Fractured Horizontal Wells in Stratified Gas Condensate Reservoirs", SPE 37995, 1997.*
Park et al, "Streamline-Based Simulation to Investigate Interwell Connectivity and Tracer Transport in 3D Discrete Fractured Reservoir", SPE 100216, SPE Europe/EAGE Annual Conference and Exhibition, Jun. 12-15, 2006.*

* cited by examiner

*Primary Examiner* — Mary C Jacob
(74) *Attorney, Agent, or Firm* — Toler Law Group, IP

(57) ABSTRACT

A method and system for generating an unstructured automatic mesh and executing computational algorithms using a finite element numerical approach is disclosed. The method is to model a hydrocarbon reservoir, wells, and completions as a single system, accounting for static information and transient behavior of wells, hydraulic fractures and reservoirs in a single model.

13 Claims, 29 Drawing Sheets

Horizontal well with transverse hydraulic fractures showing finite element meshing.

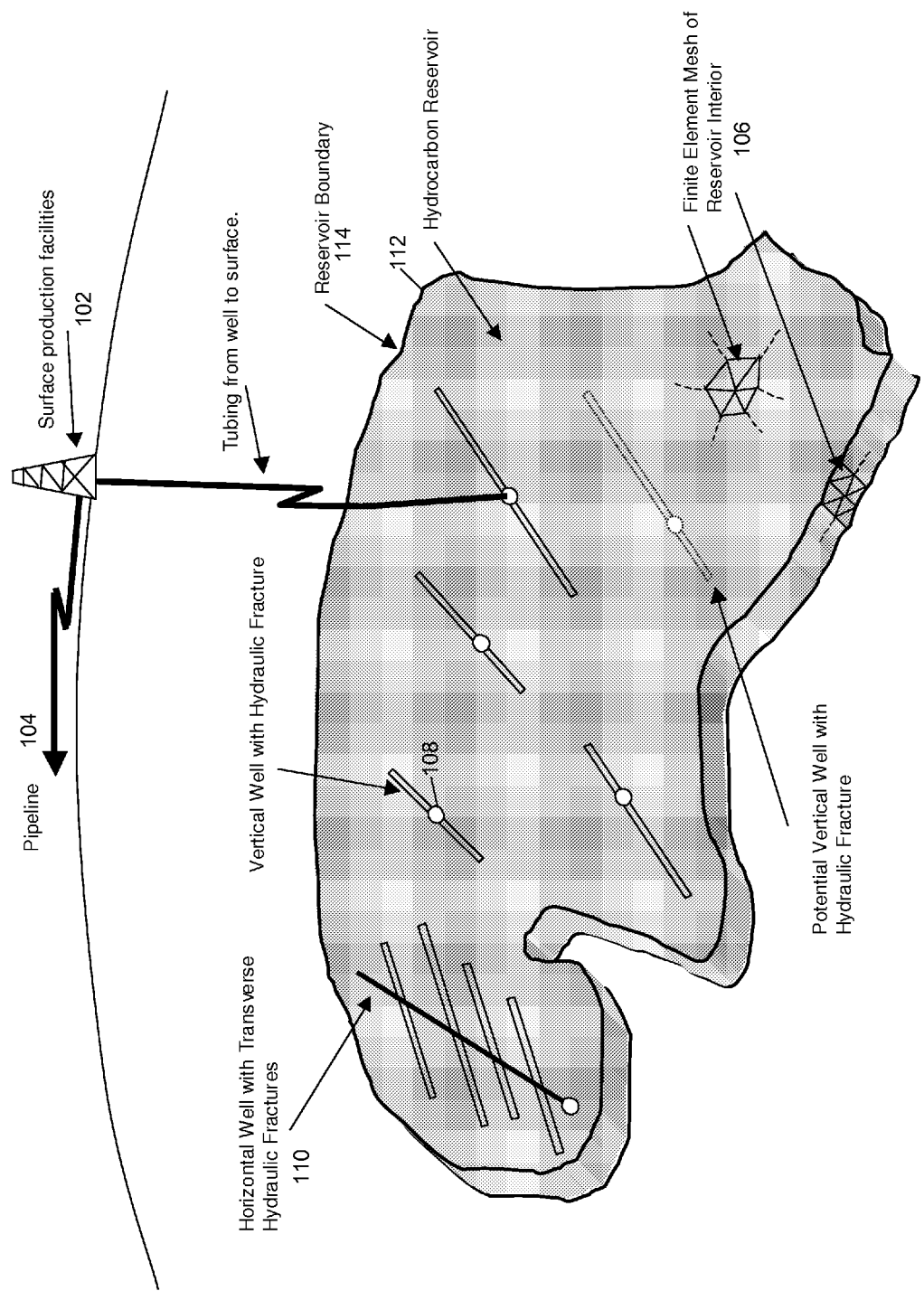
Figure 1: Schematic of reservoir, well, and hydraulic fracture showing location of Finite Element Mesh.

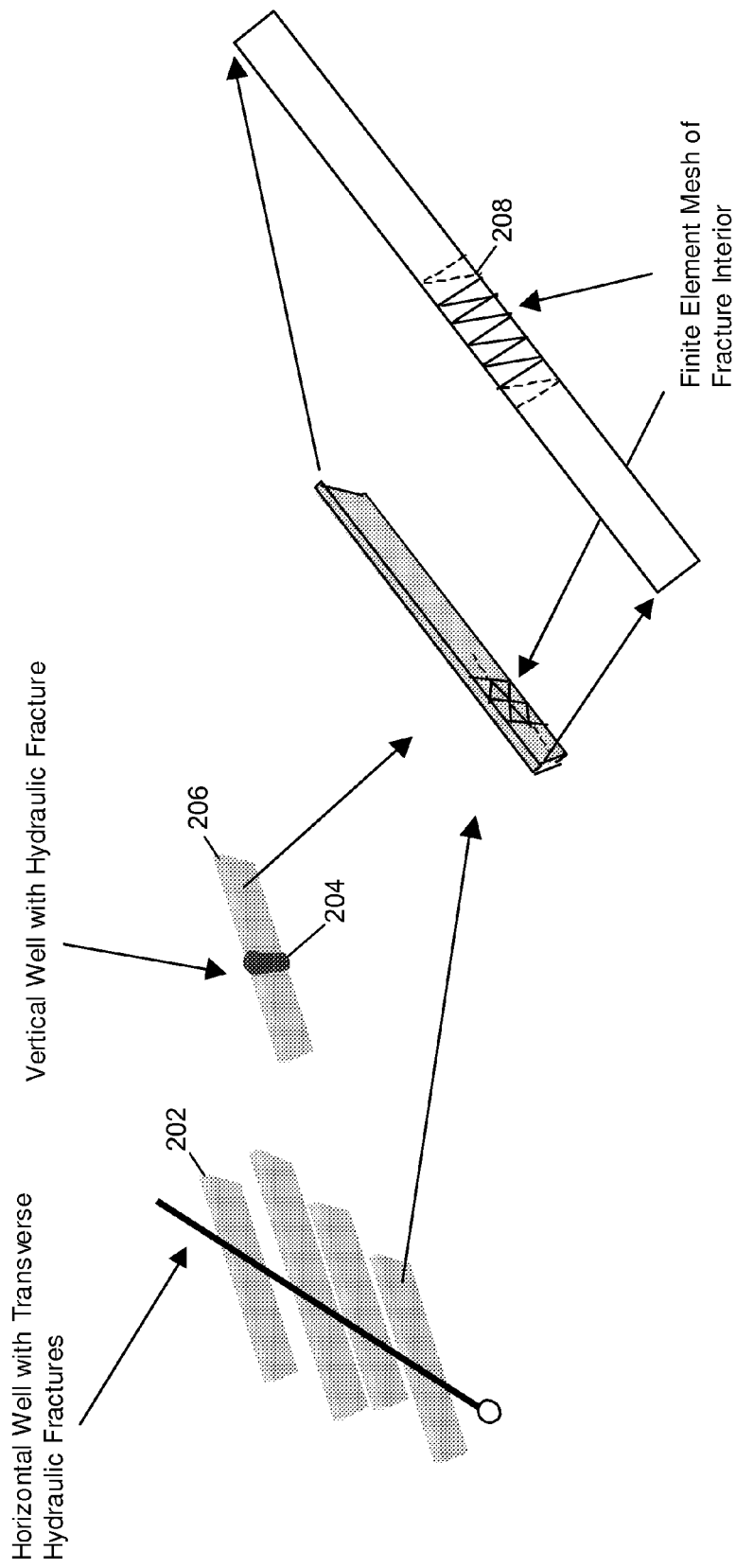
Figure 2a: Schematic of mesh filling the interior of the fracture.

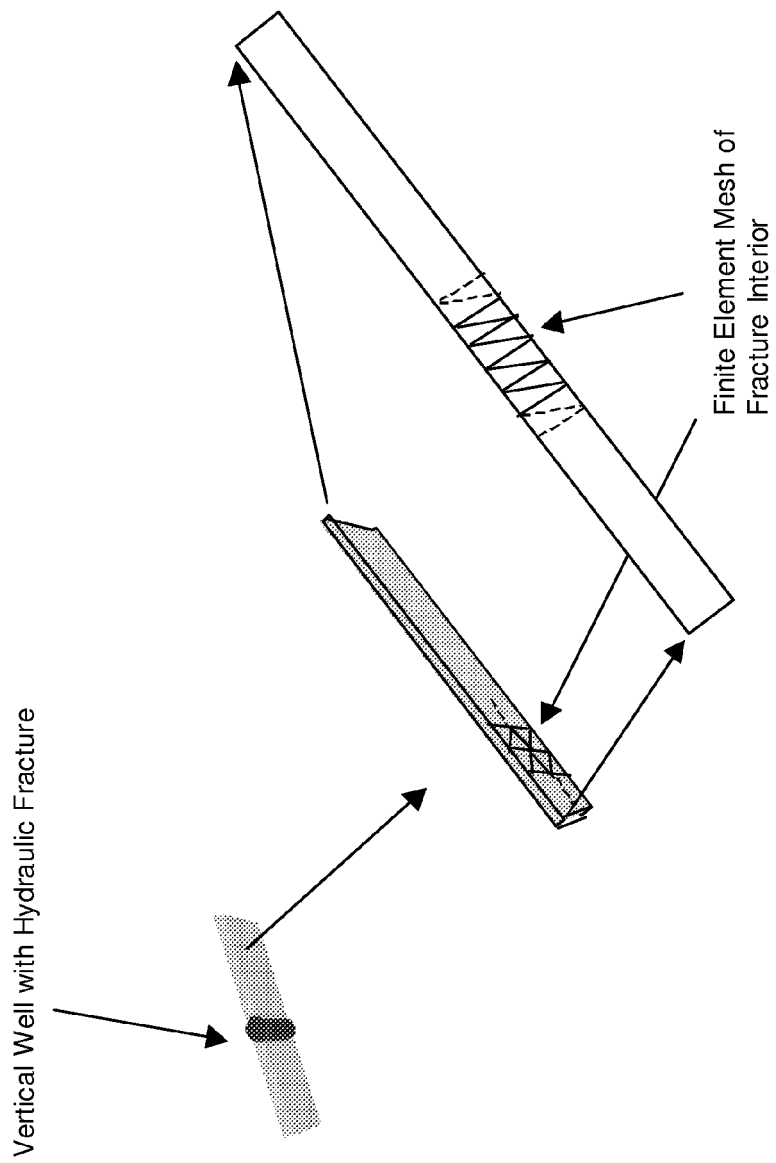
Figure 2a-1: Schematic of mesh filling the interior of the fracture for a vertical well.

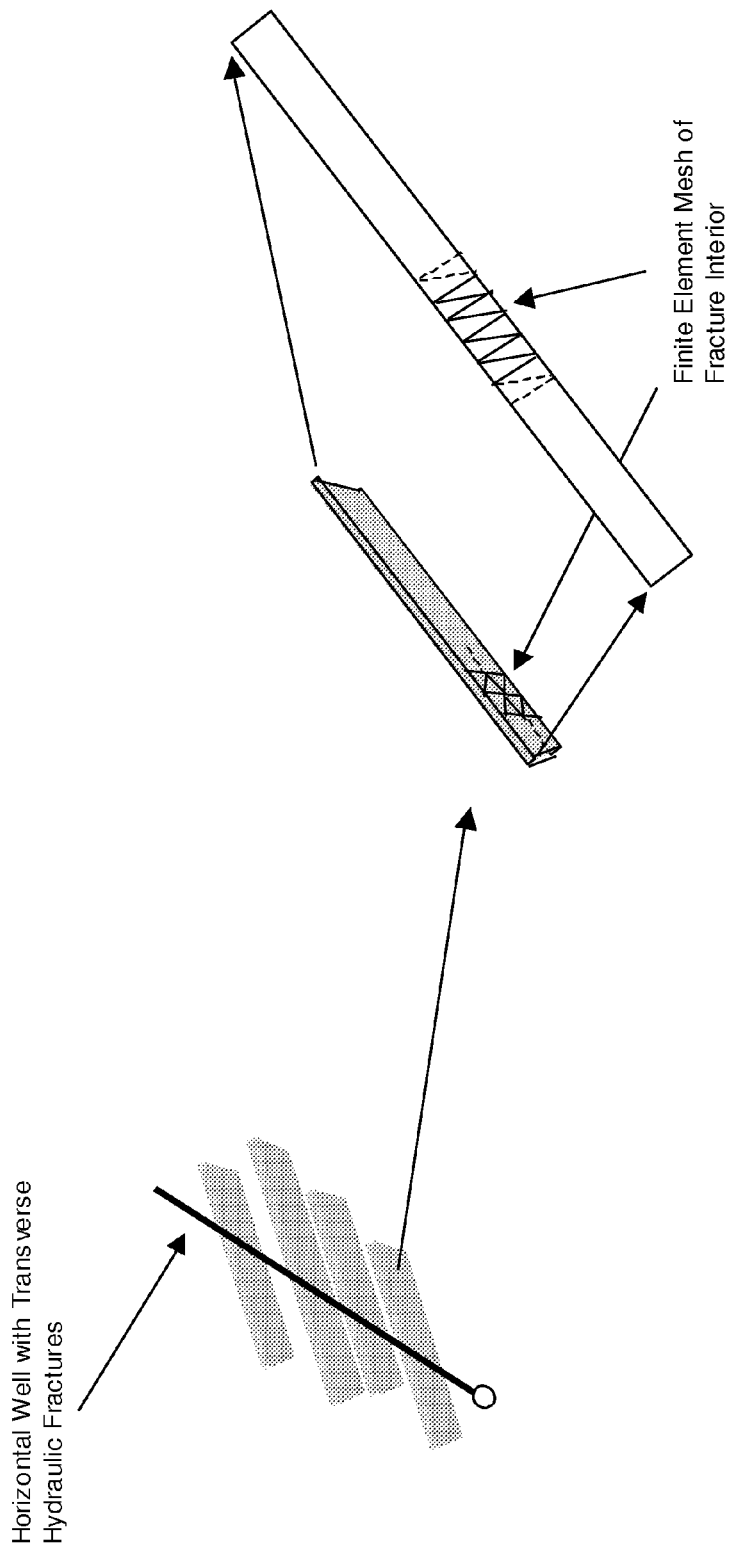
Figure 2a-2: Schematic of mesh filling the interior of the fracture for a horizontal well with transverse fractures.

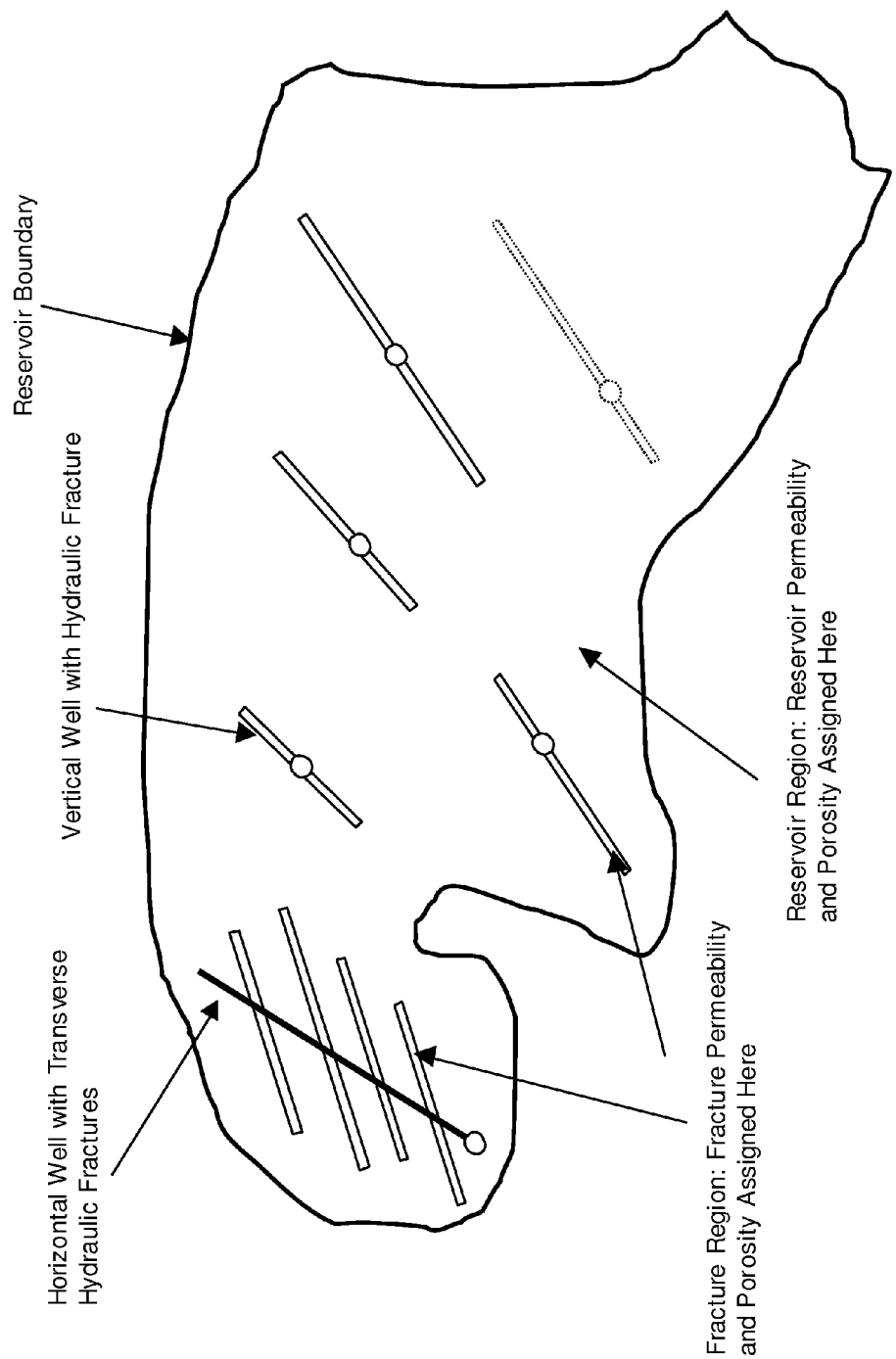
Figure 3: Schematic of properties of fracture propant.

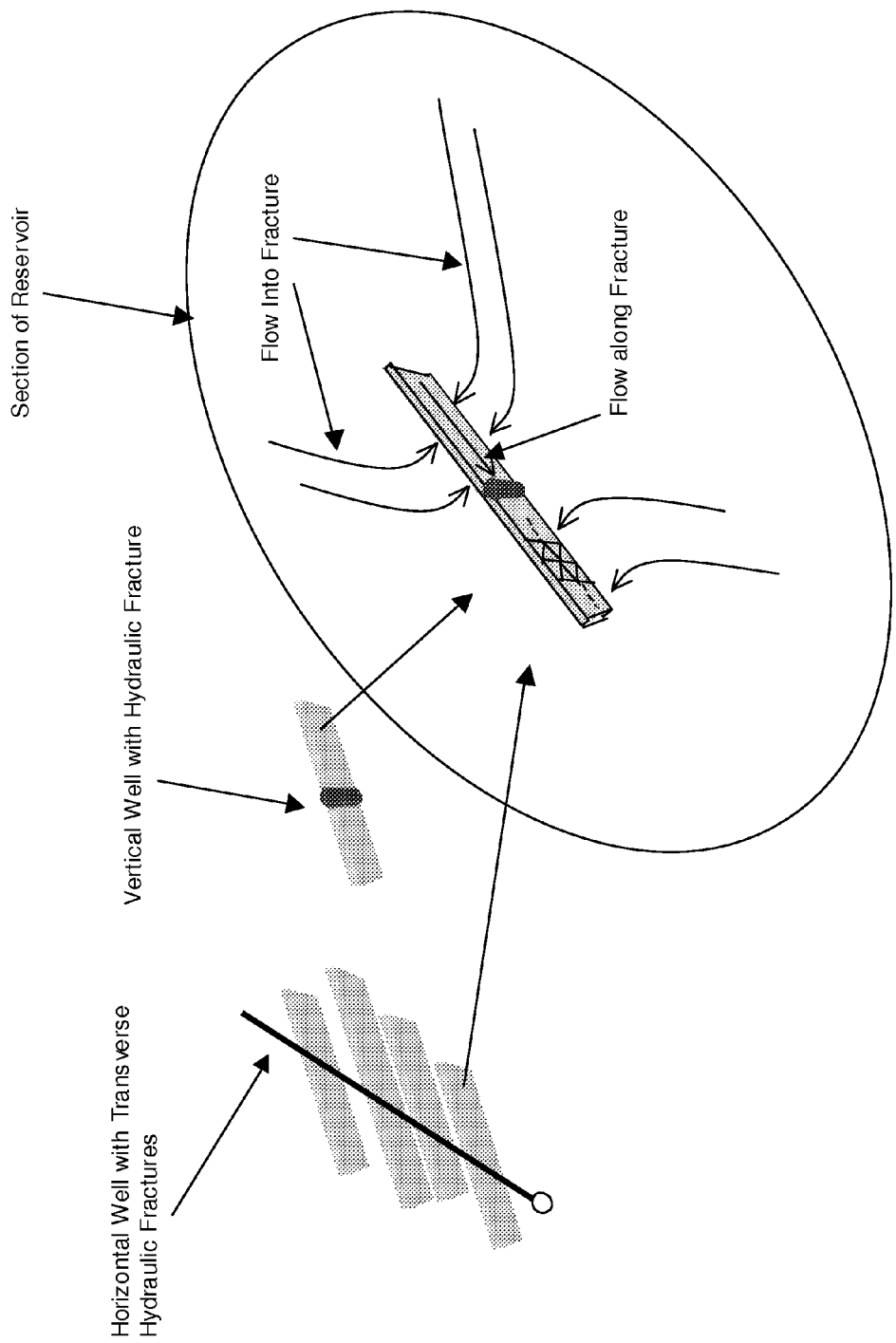
Figure 4: Flow into the fracture, along the fracture and into the wellbore through finite element connections.

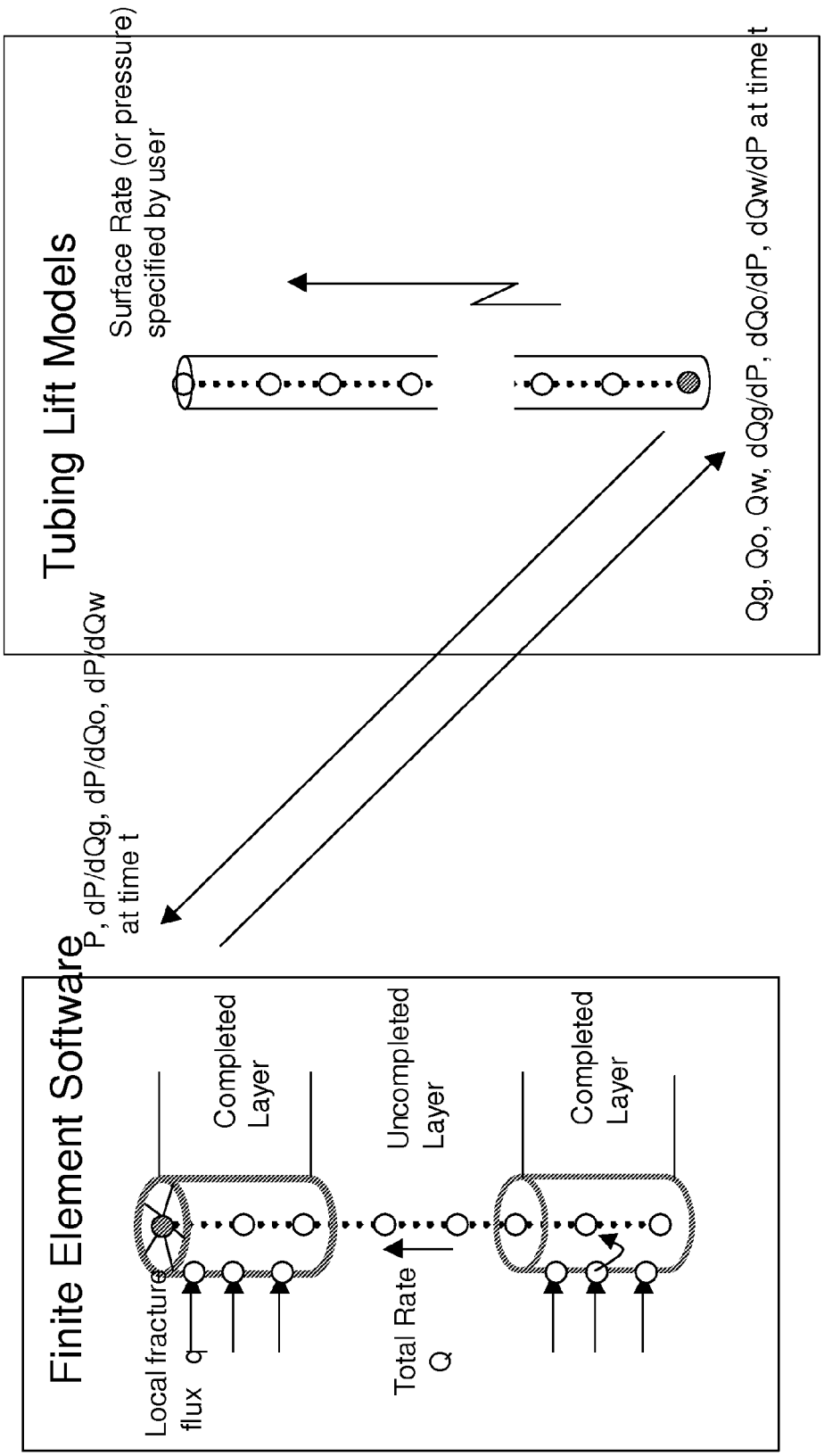
Figure 5: Flow along the wellbore centerline finite element connections up the tubing and to the surface.

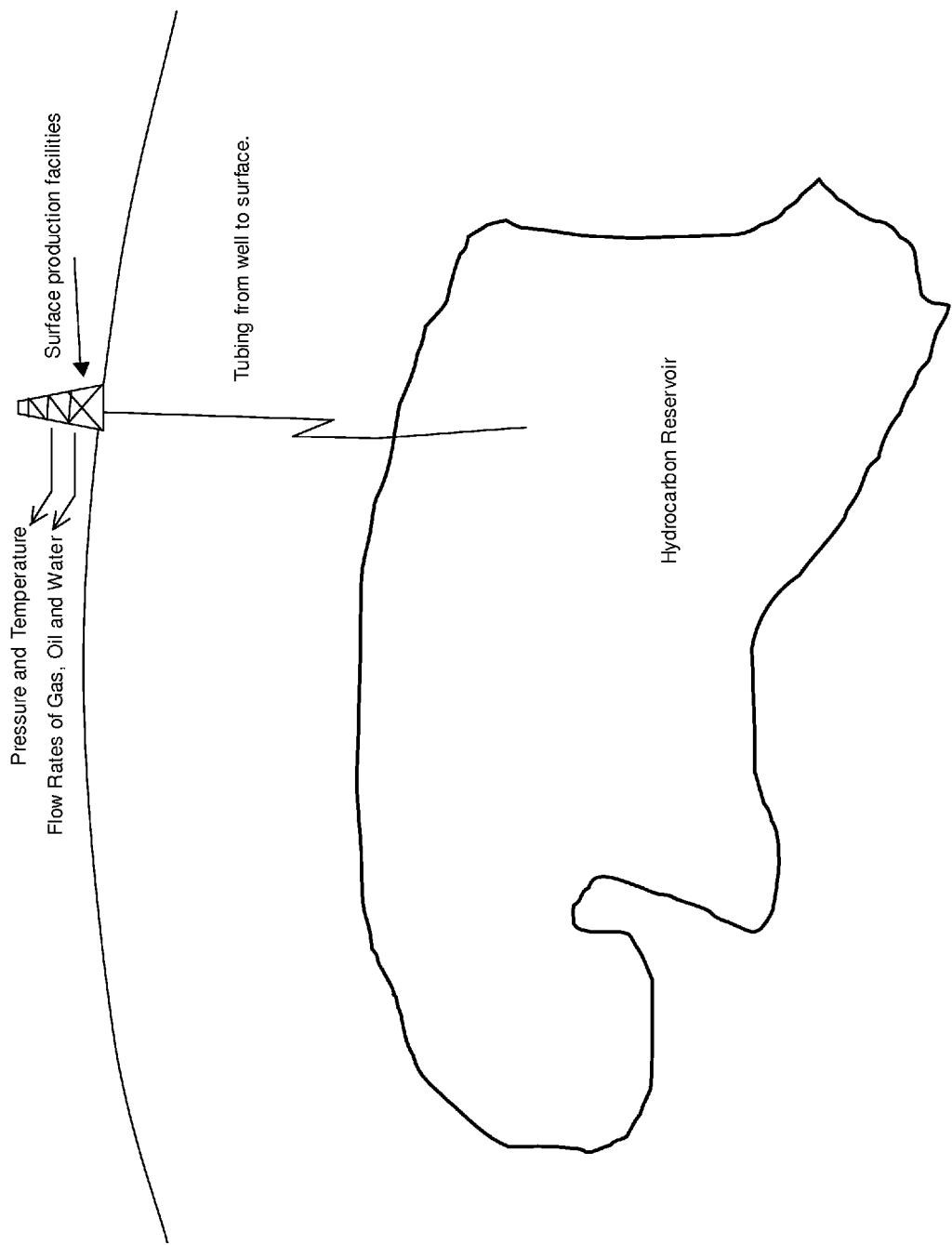
Figure 6: Measurement of flow and pressure at the surface.

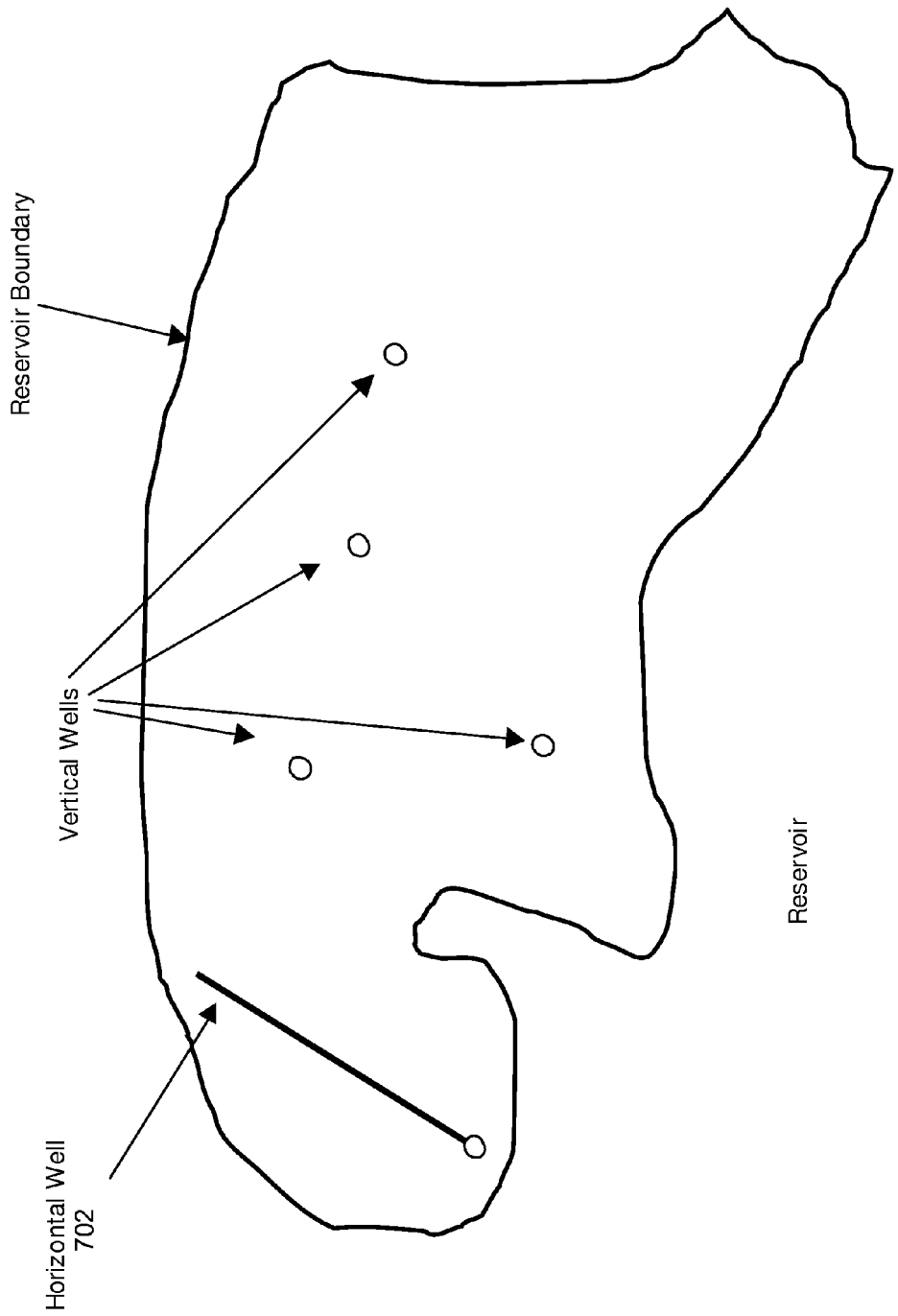
Figure 7: A reservoir with wells drilled from a top (areal) view.

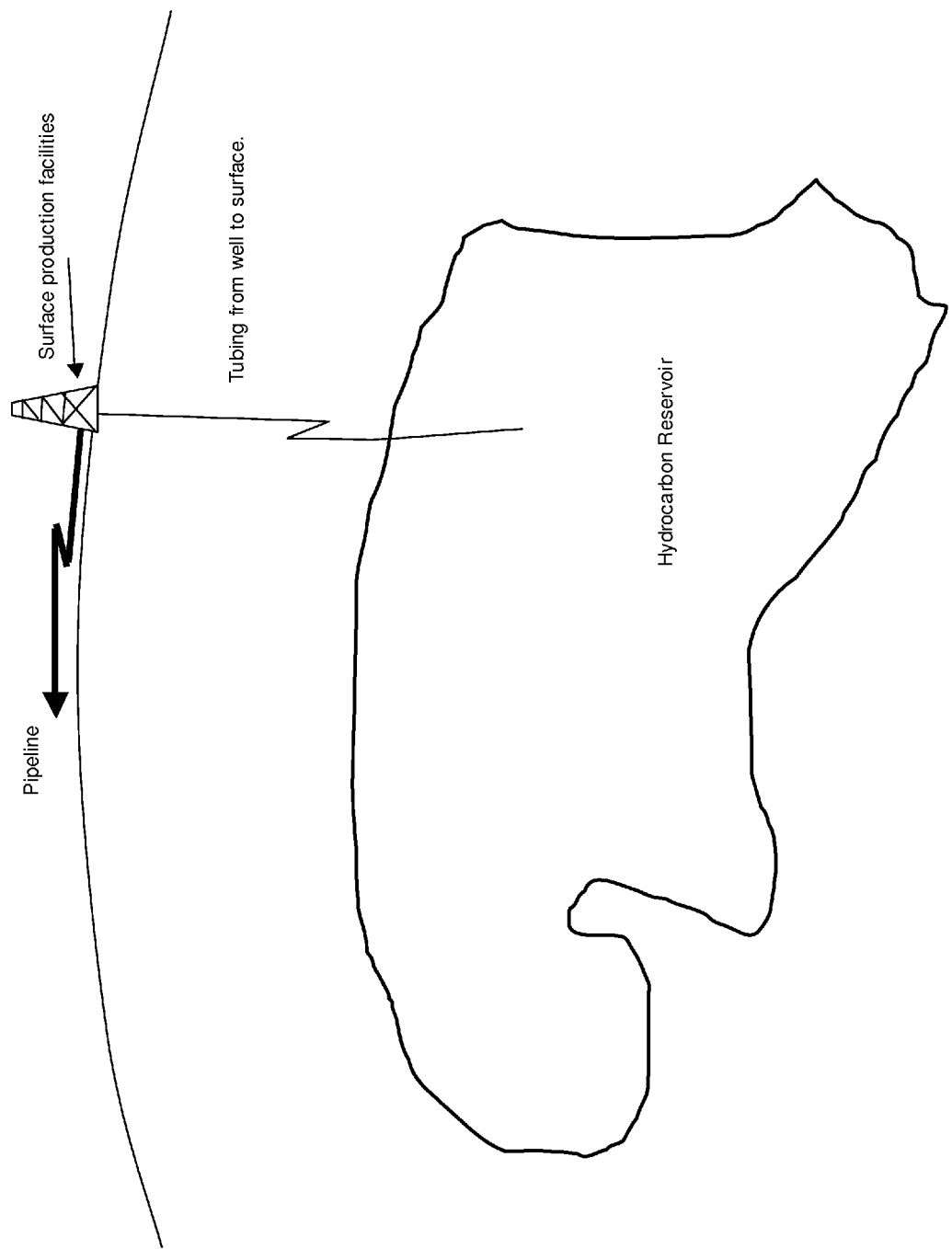
Figure 8a: Fluids produced to the surface are transported by pipeline.

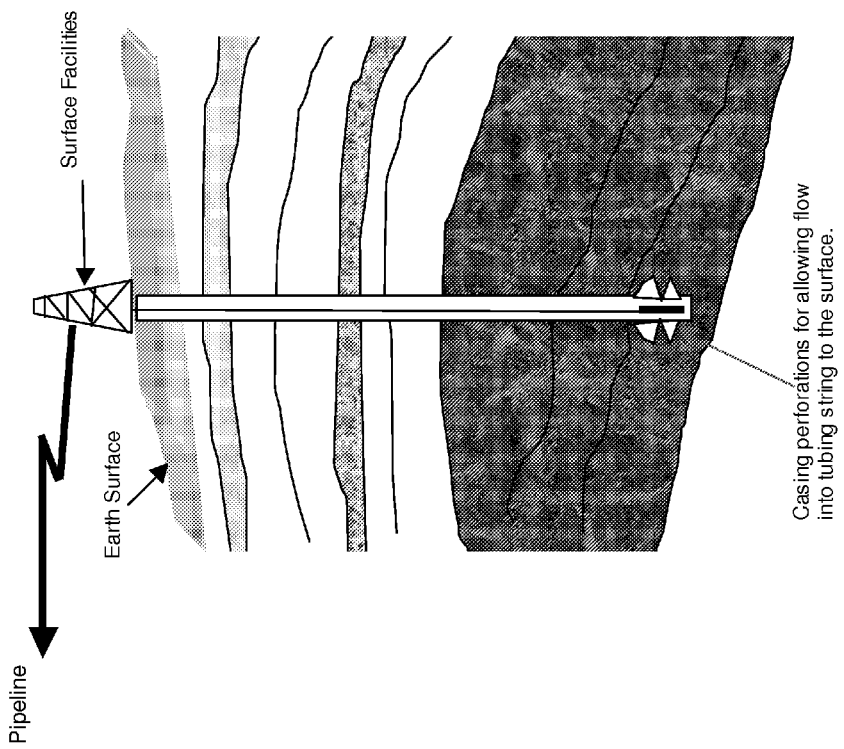
Figure 8b: Shows a reservoir with a well in cross-section showing tubing flow to the surface and surface facilities and processing followed by pipeline connections

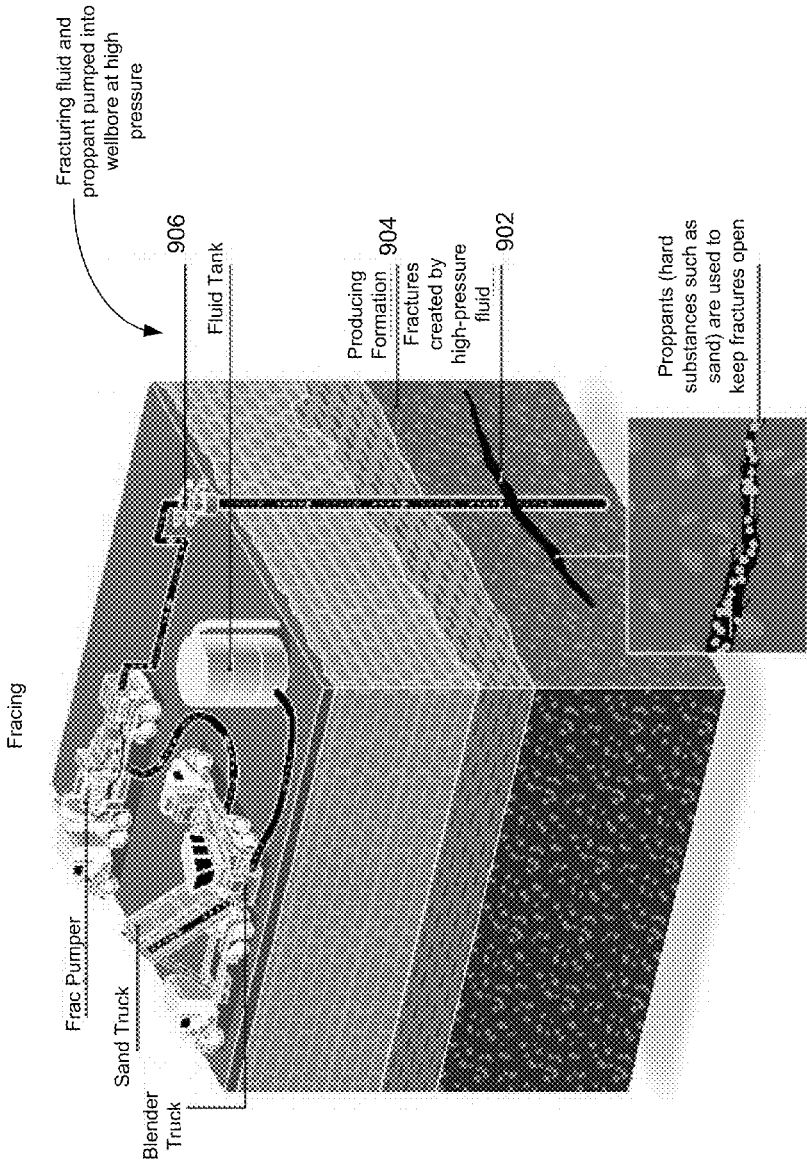
Figure 9: The process of pumping hydraulic frac'ing fluids to produce fracture simulation.

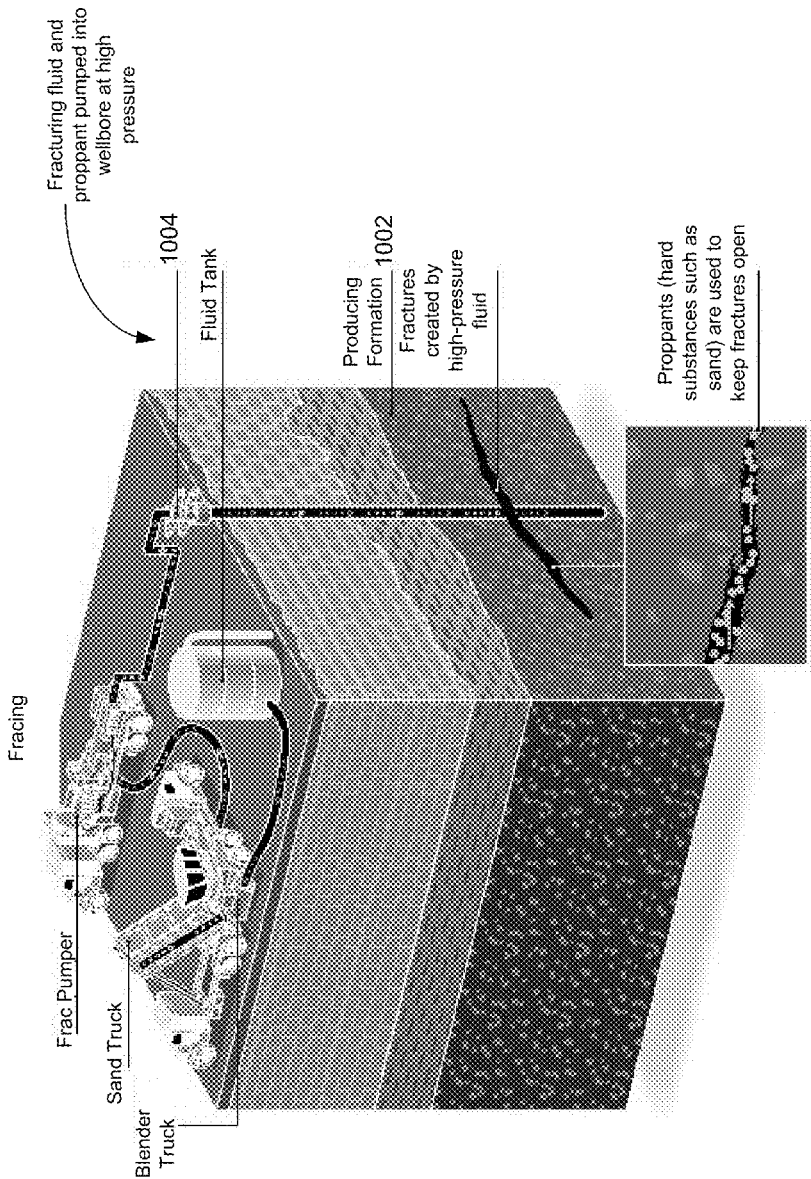
Figure 10: Fracture stimulation treatment ongoing through the pumping of fluids and proppant into the formation through the formations

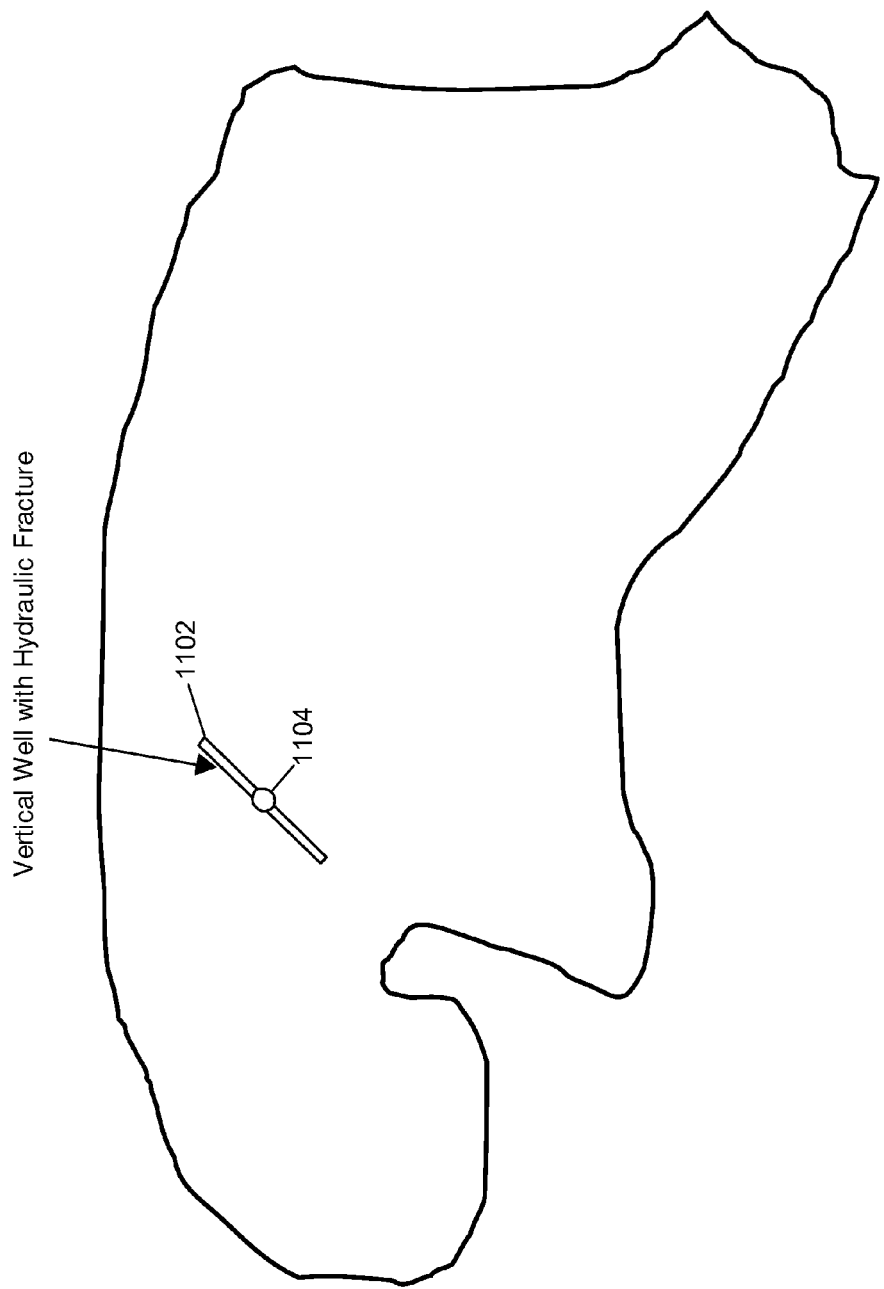
Figure 11: Areal extent of a hydraulic fracture for a vertical well

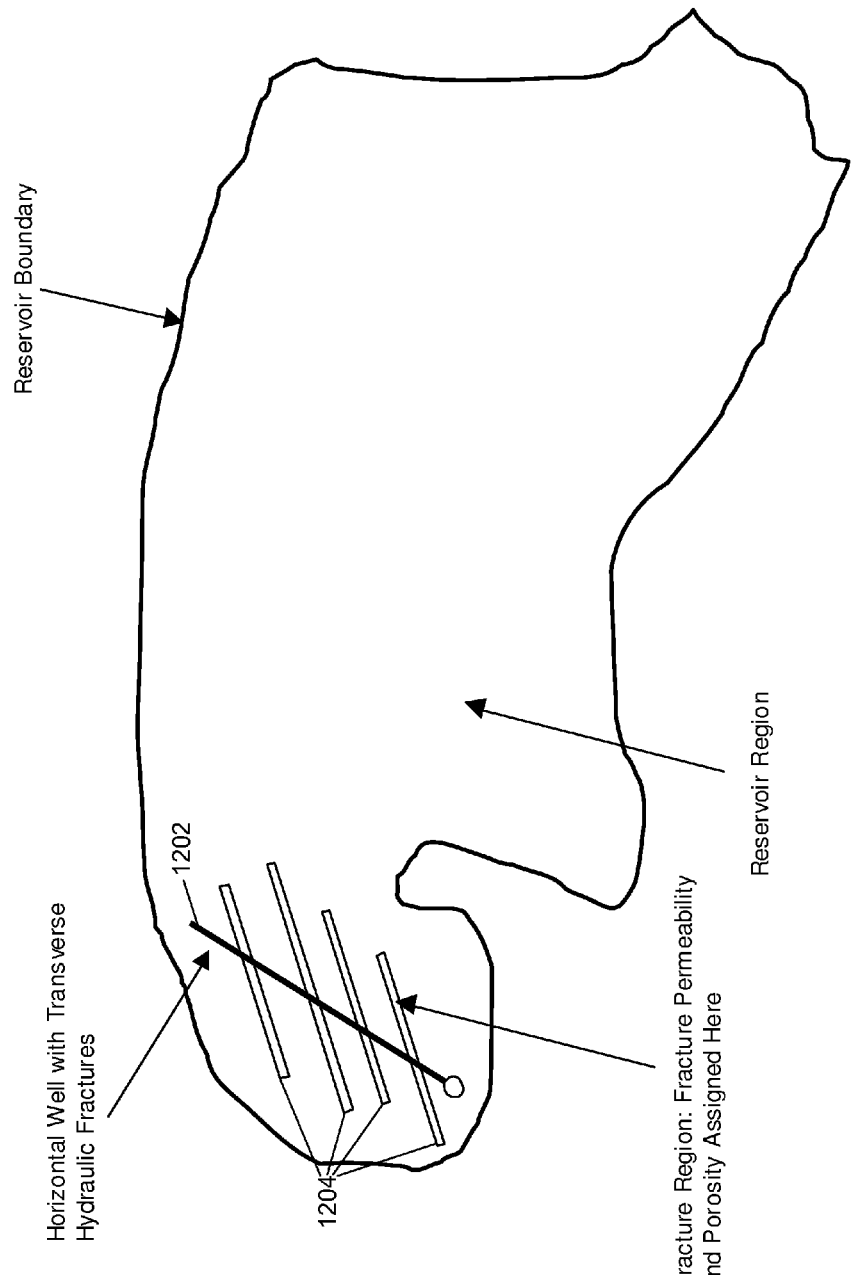
Figure 12: shows the areal extent of a plurality of hydraulic fractures transverse to the trajectory of a horizontal well

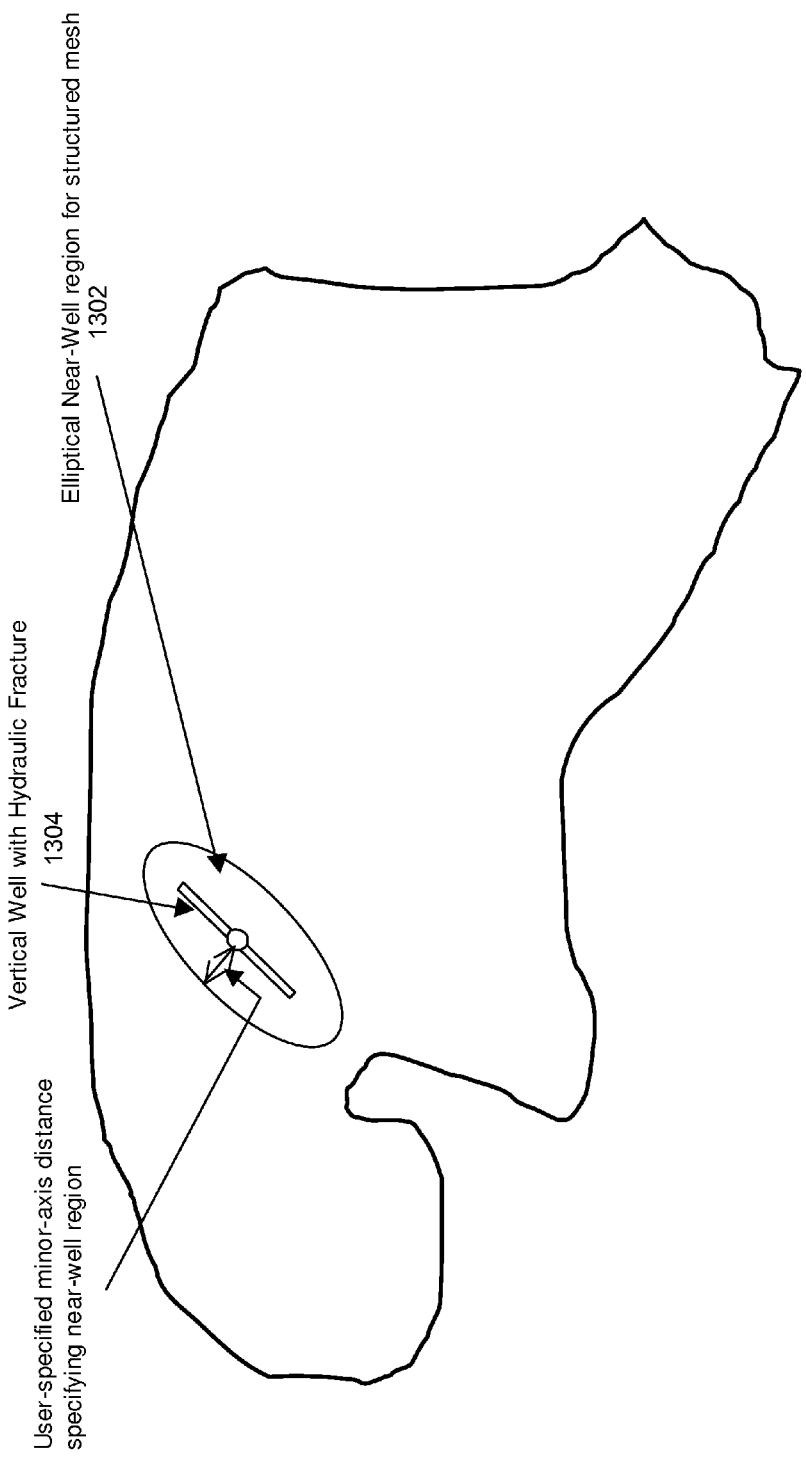
Figure 13: The near-well region specified by the user for a vertical fractured well

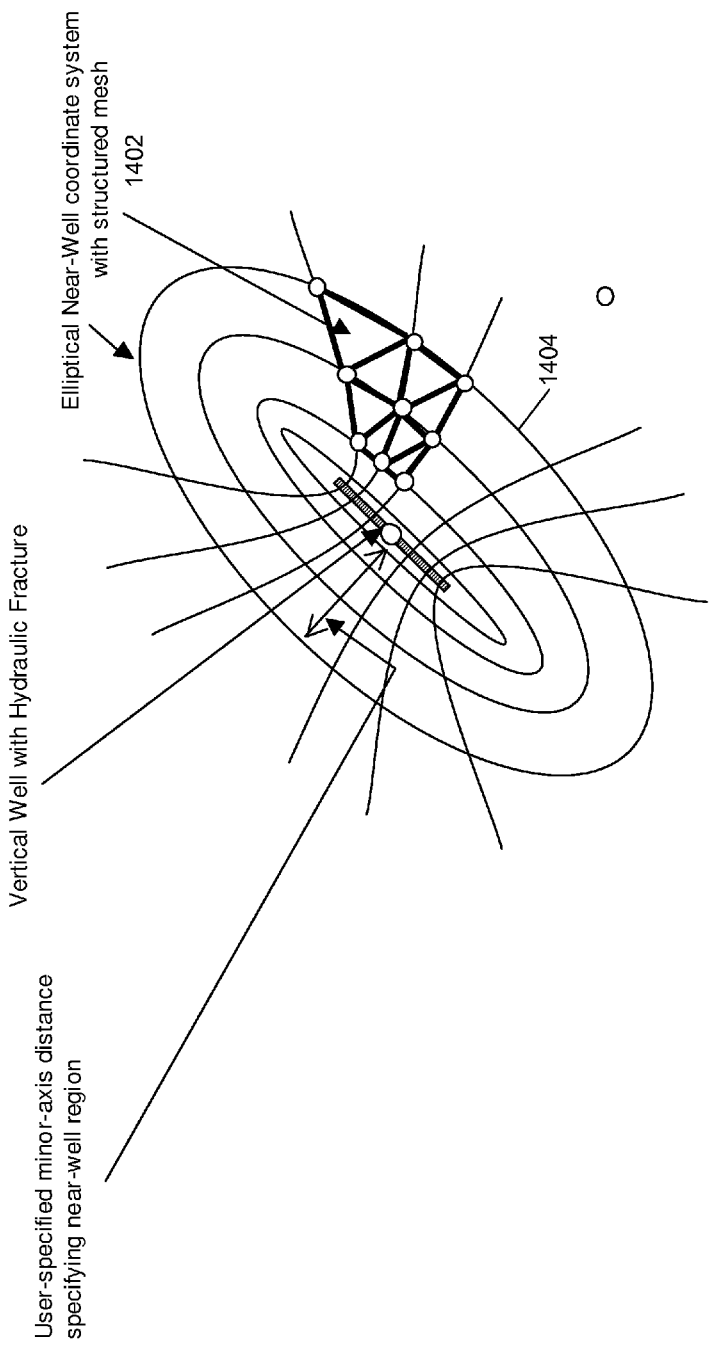
Figure 14: The near-well region specified by the user for a vertical fractured well, showing elliptical coordinate system and structured mesh.

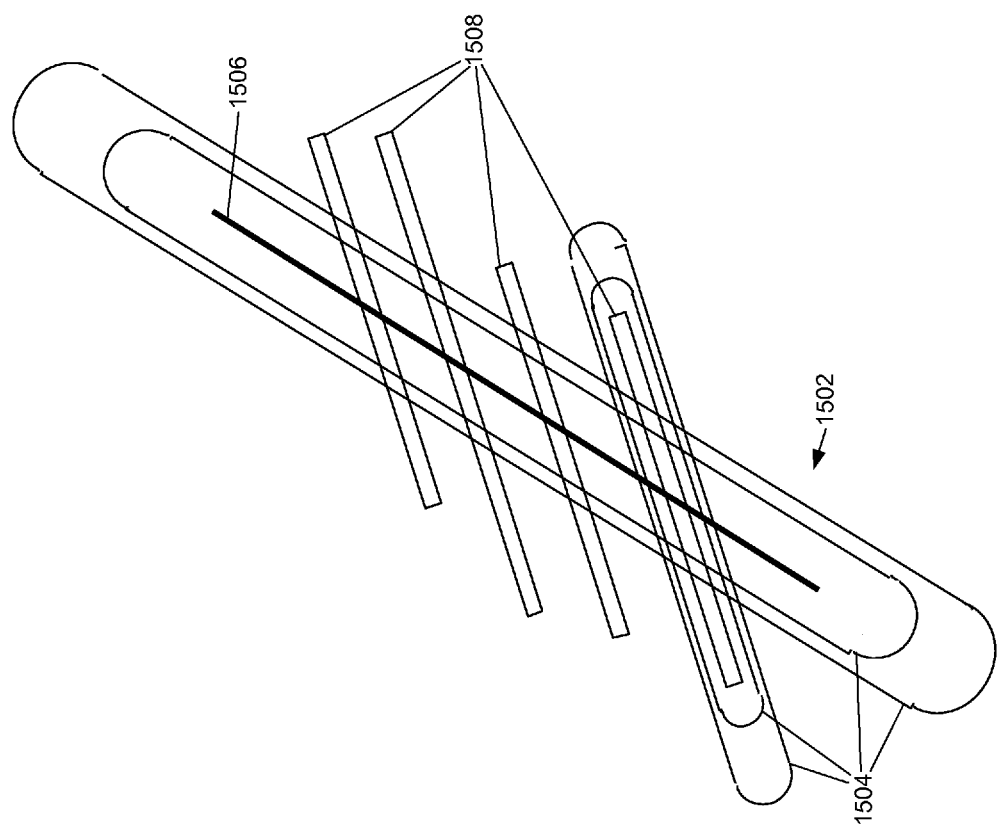
Figure 15: Showing the near-well region with rings and mesh spacing specified by the user for a horizontal well with transverse fracs

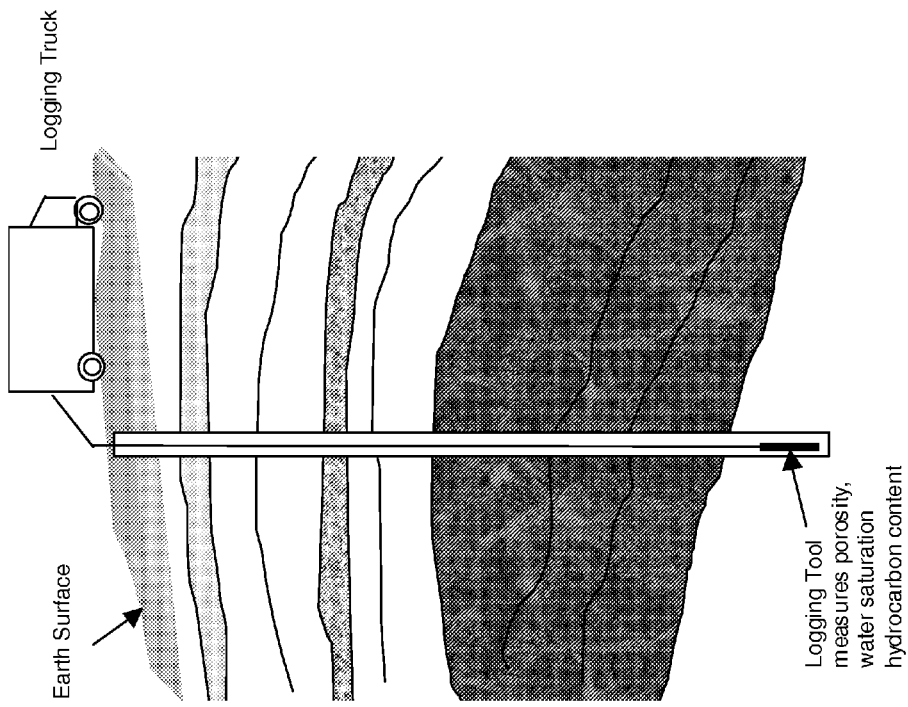
Figure 16: Process of data acquisition for near-well property data.

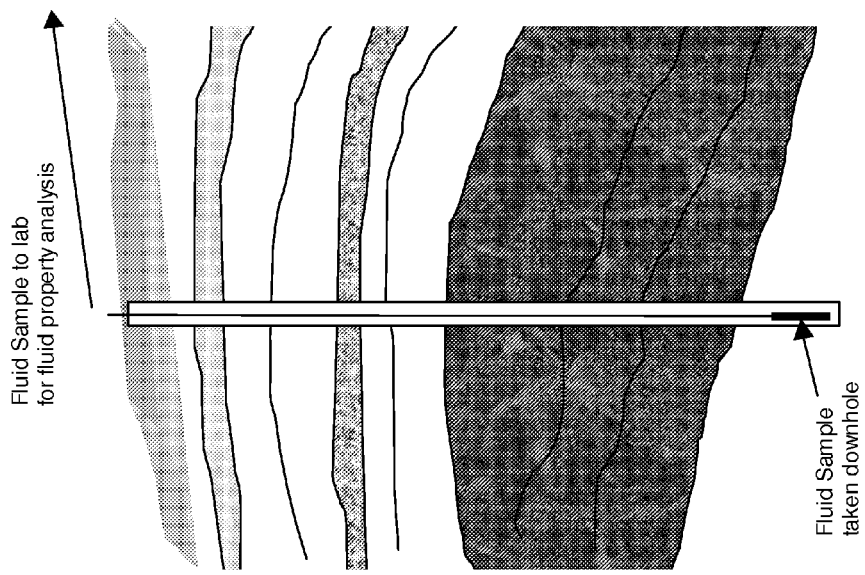
Figure 17: Process of data acquisition for fluid property data.

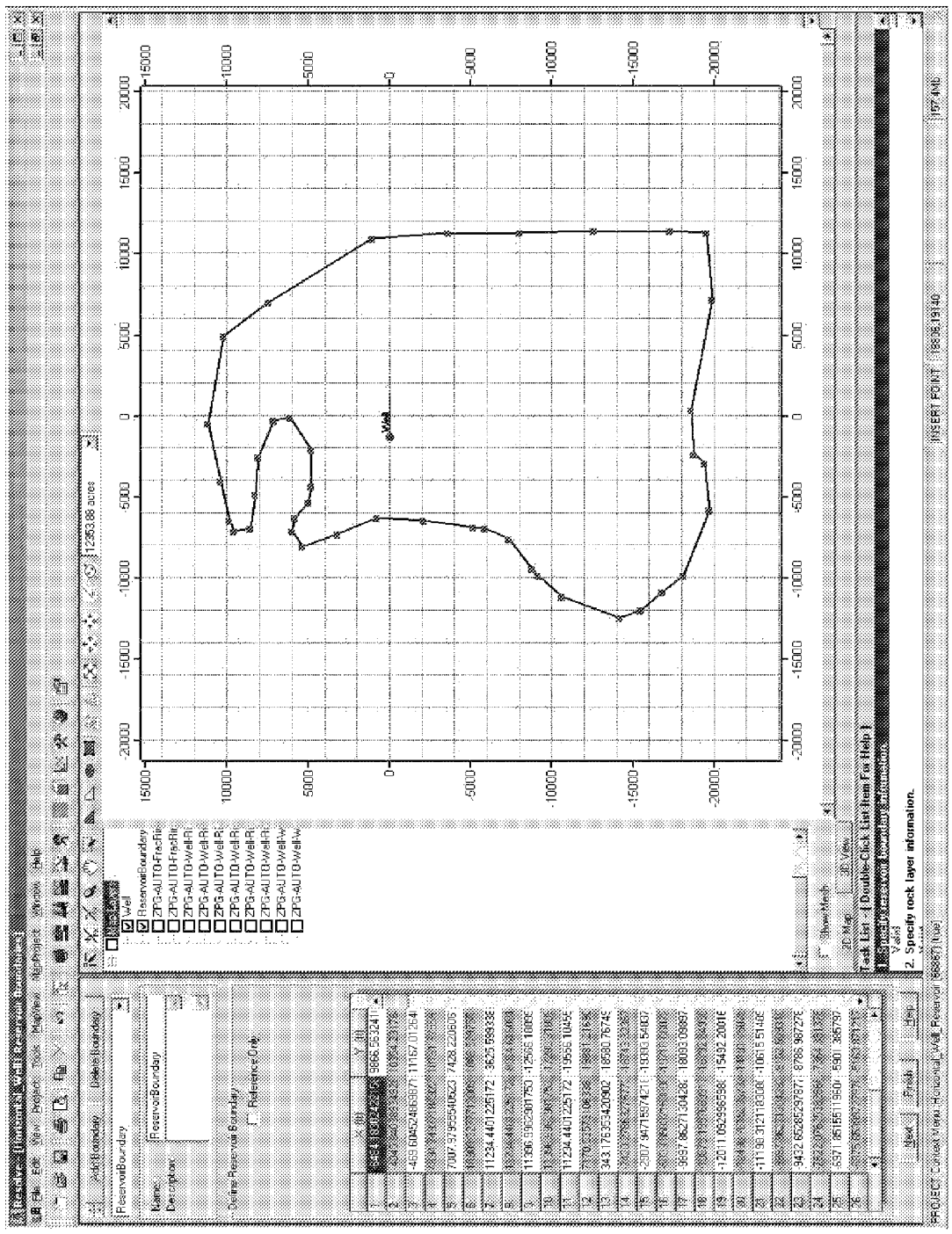
Figure 18a: Process for inputting data – reservoir boundary input

Figure 18b: Process for inputting data – well data input

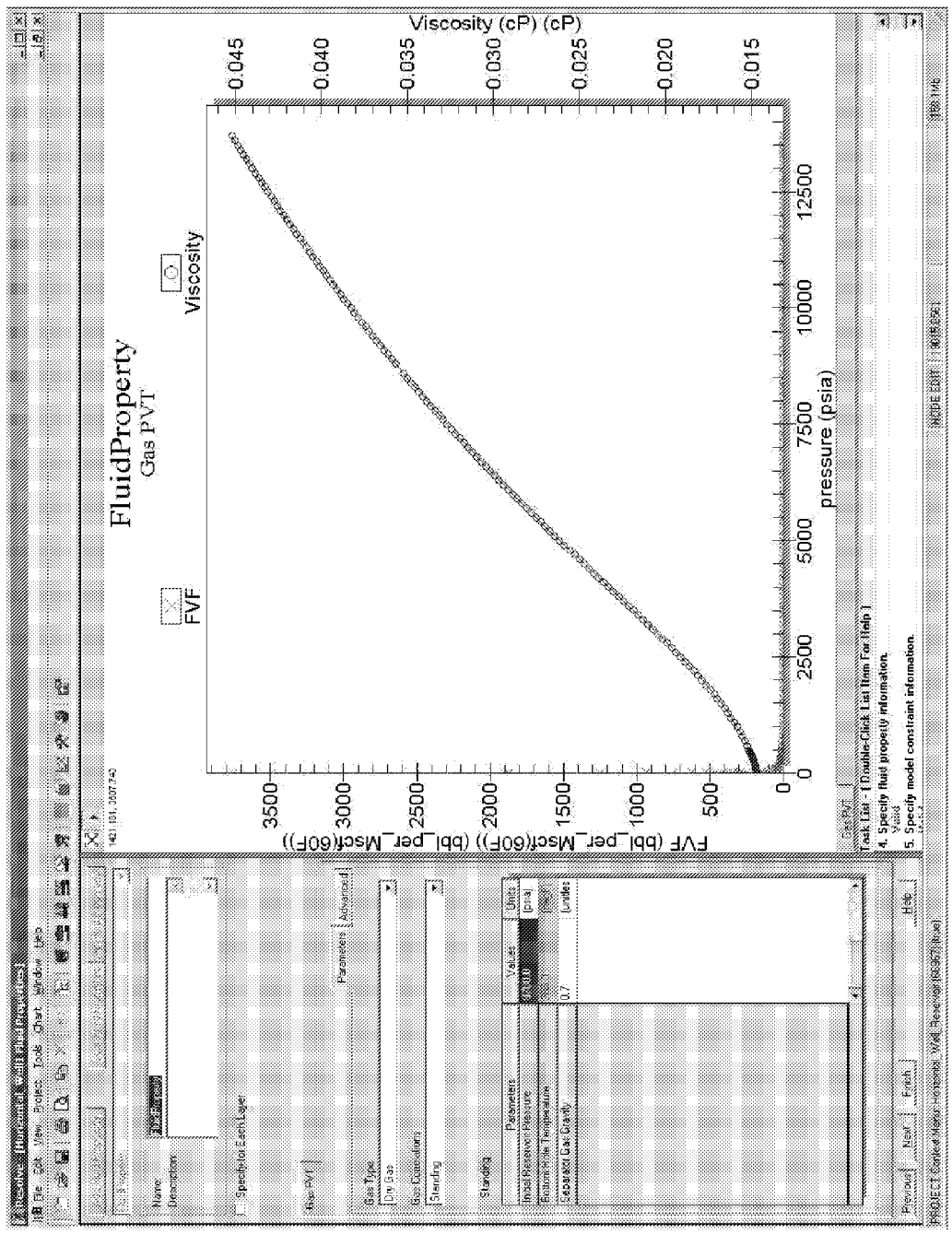
Figure 18c: Process for inputting data – Fluid Property data

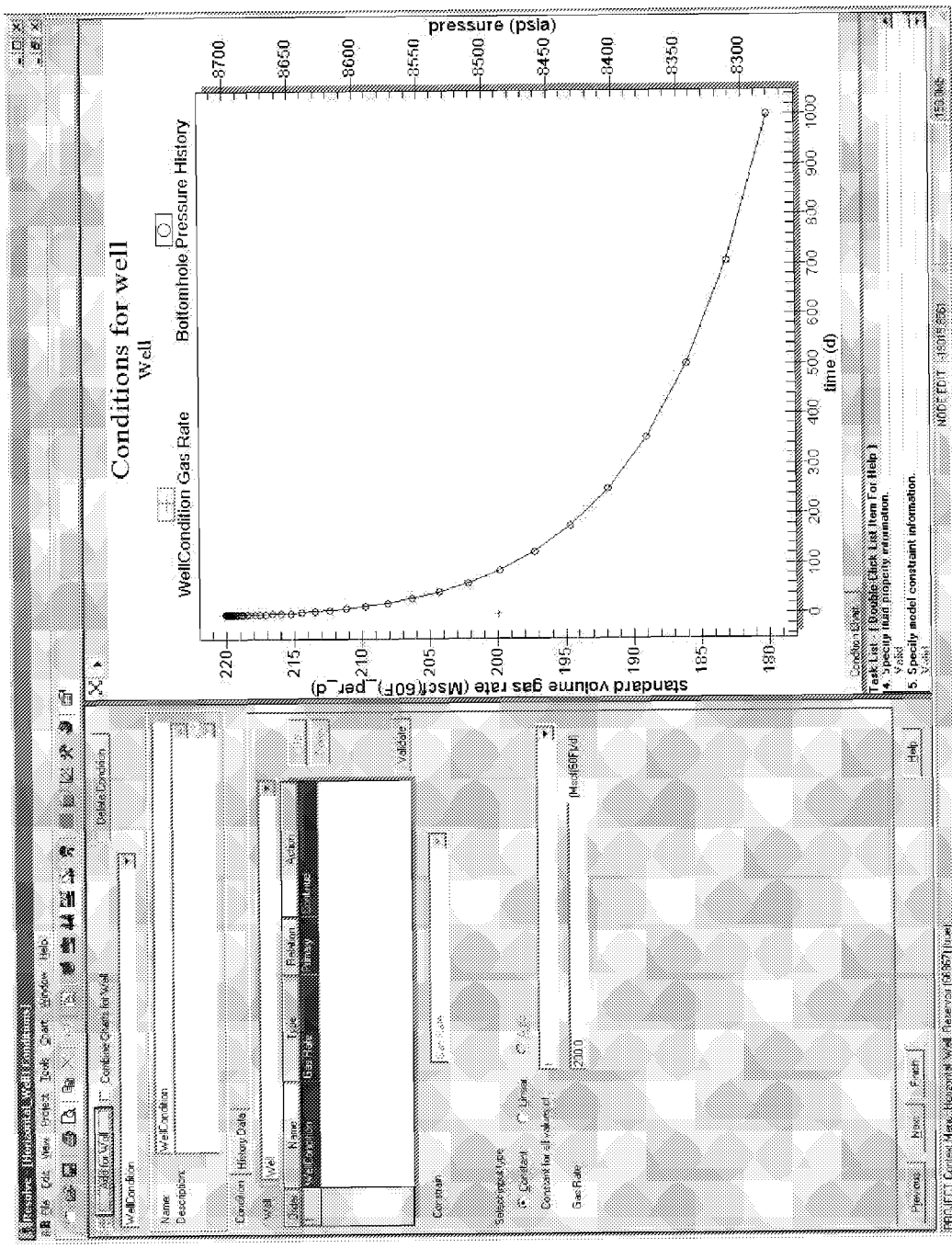
Figure 18d: Process for inputting data – Well operating conditions

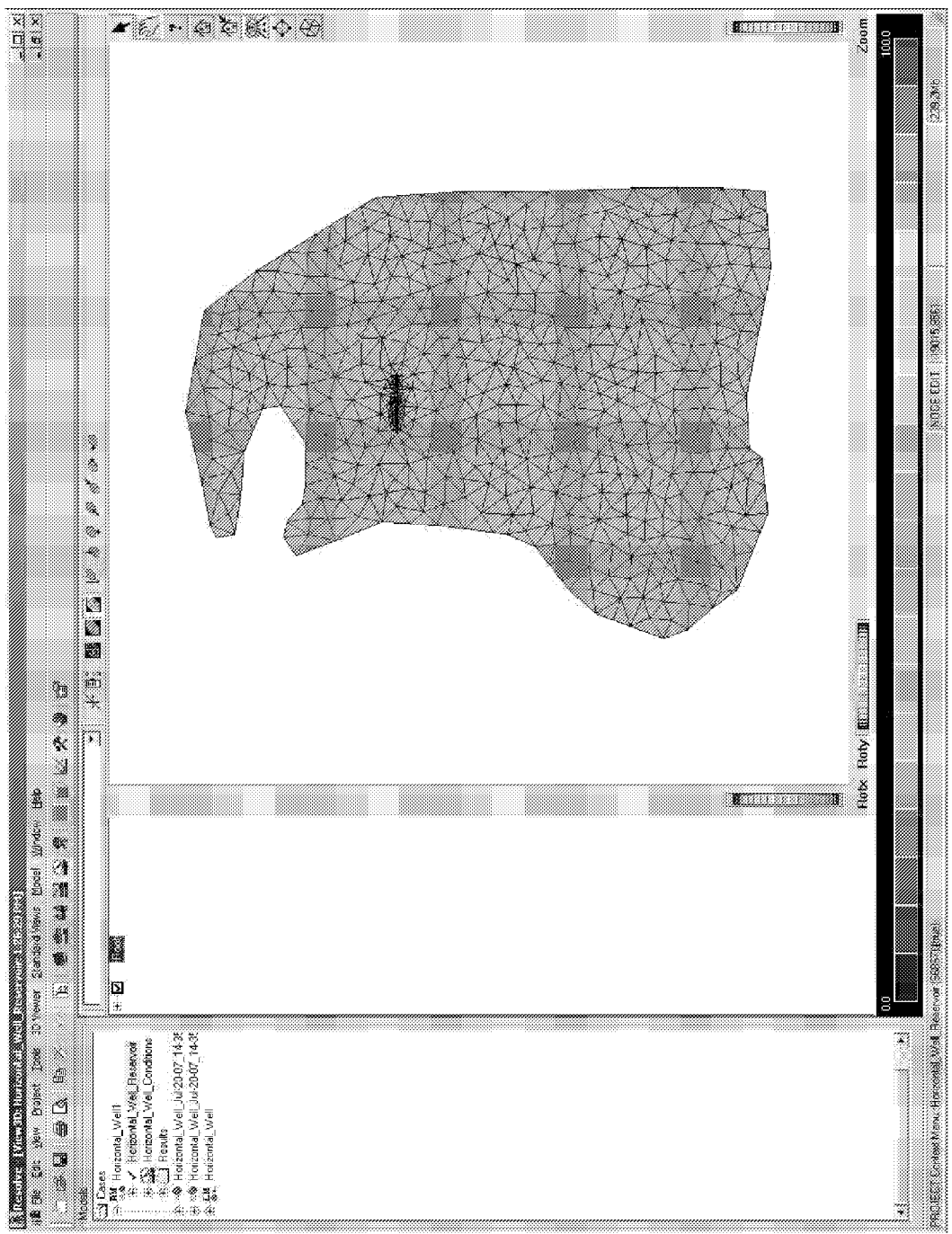
Figure 19: Automatic Mesh generation in Resolve based on user input data.

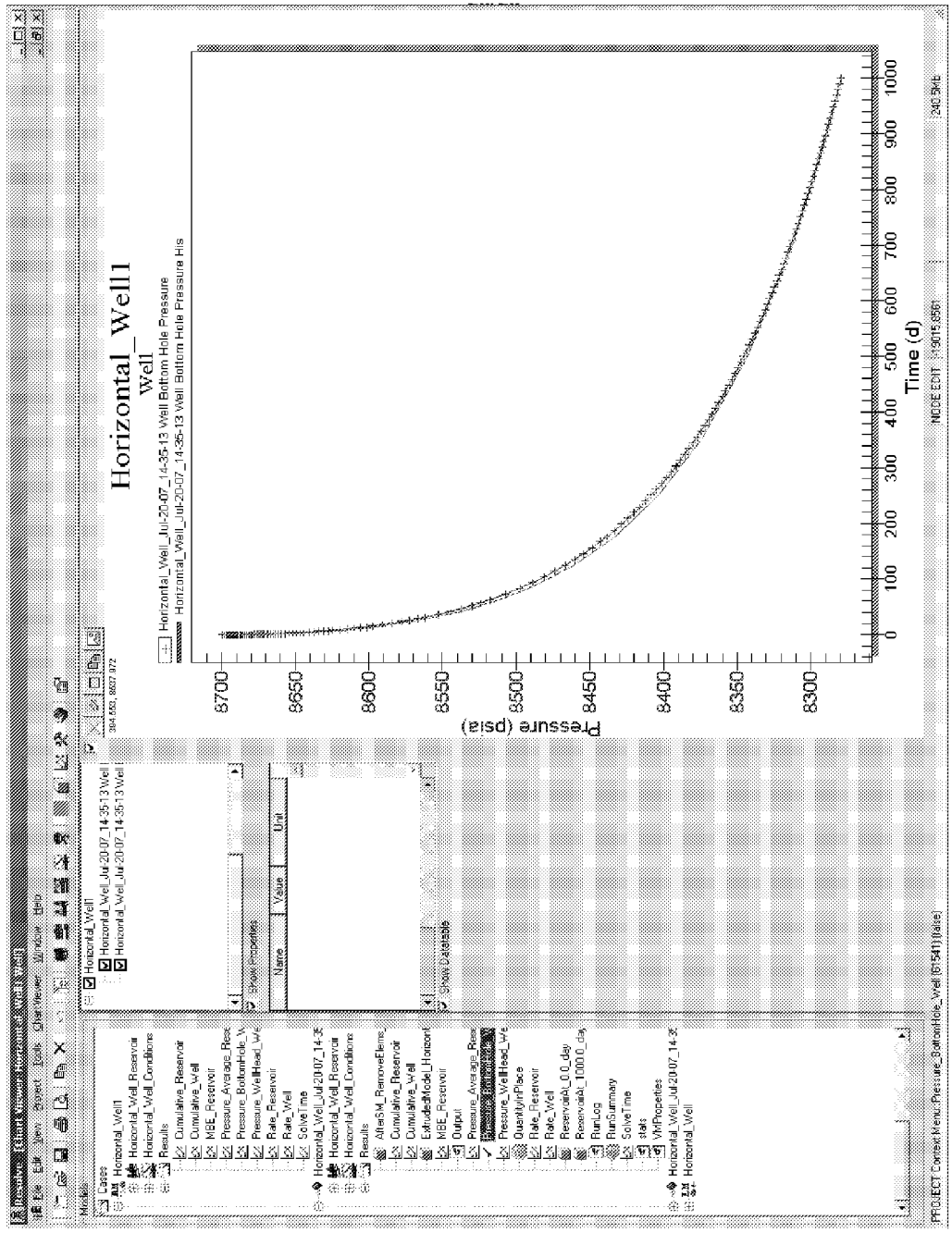
Figure 20: Output Results from Resolve on a display and recording Device

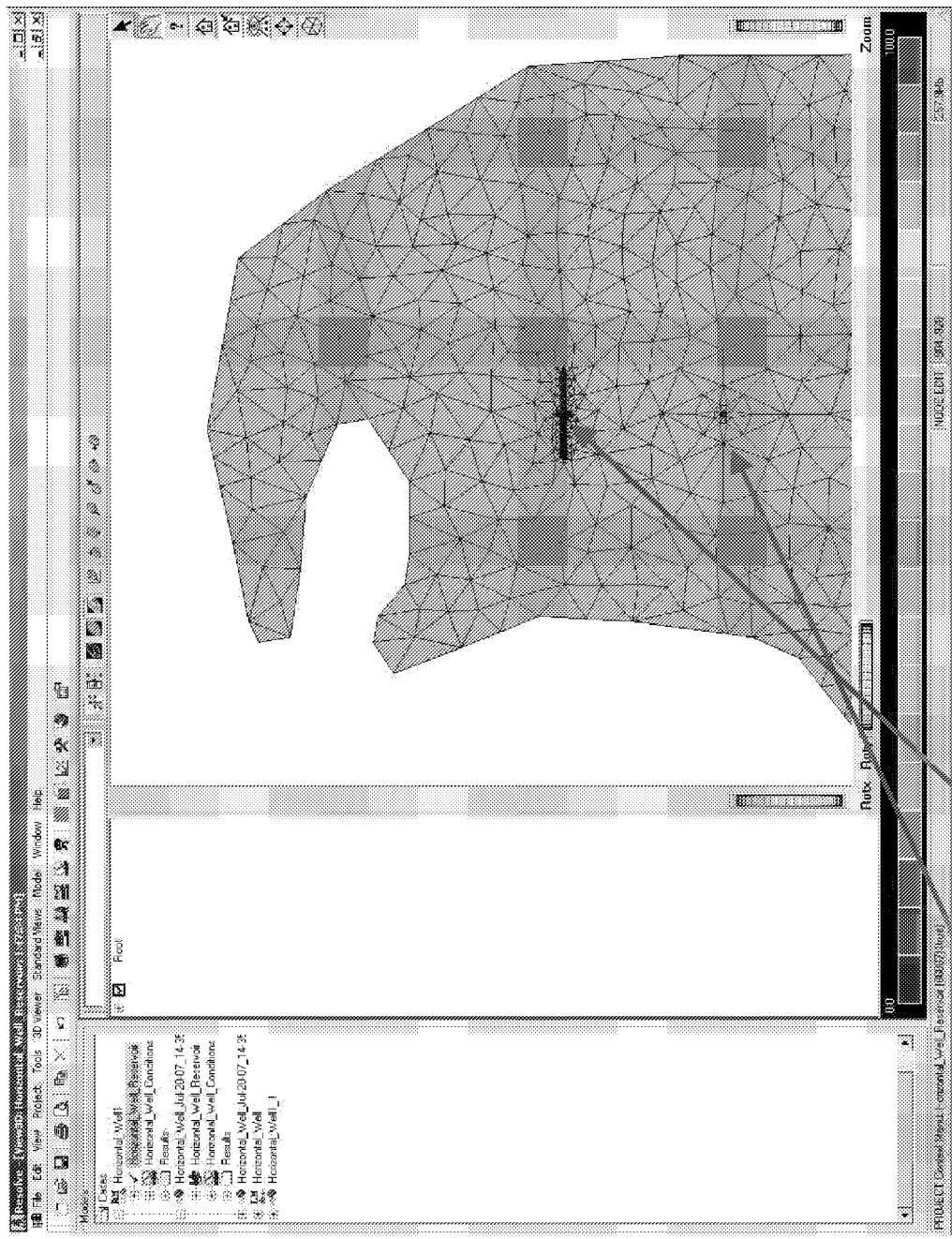
Figure 21: Radial near-well mesh smoothly embedded in unstructured reservoir mesh. a) vertical well, b) horizontal well

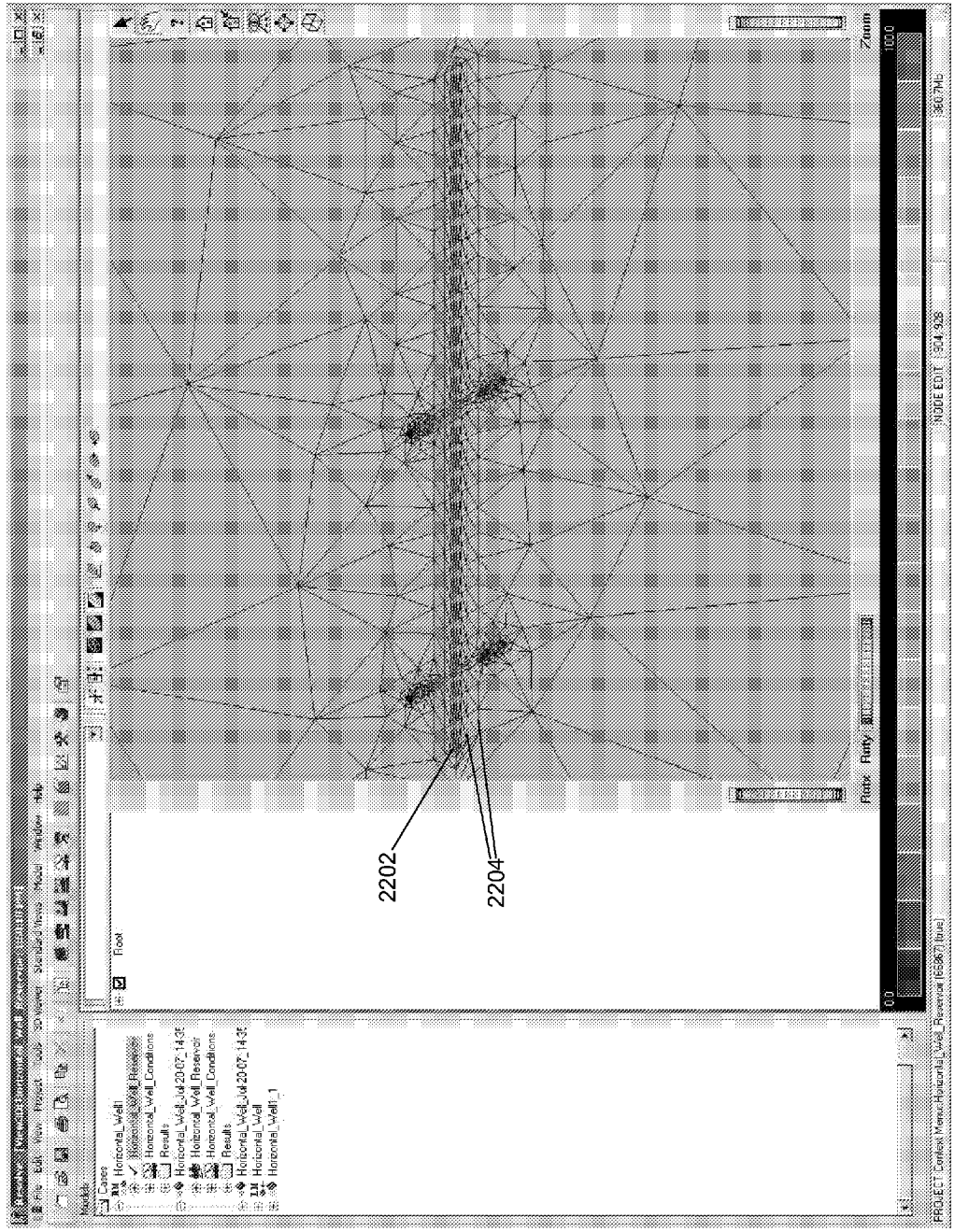
Figure 22: Horizontal well with transverse hydraulic fractures showing finite element meshing.

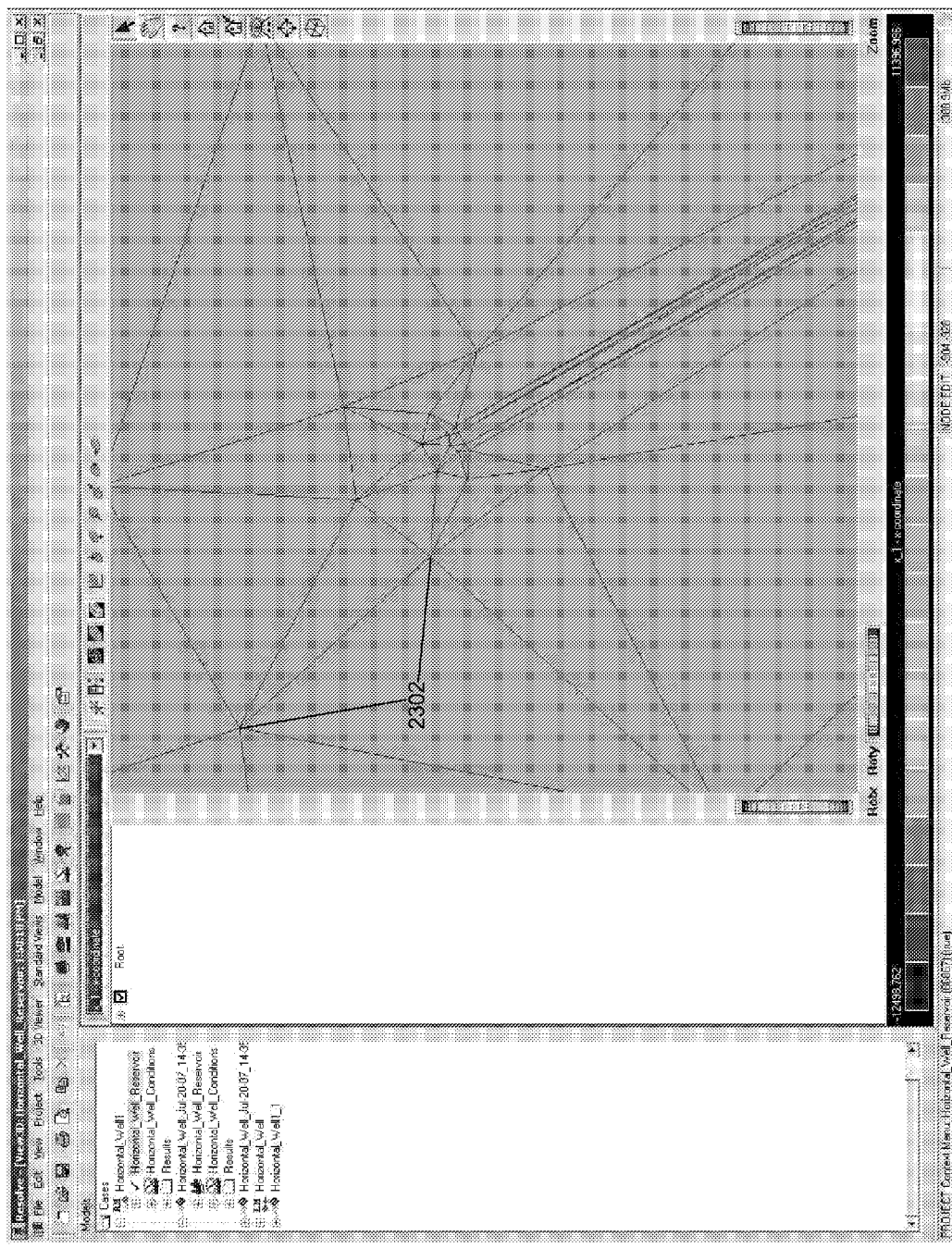
Firgure 23: Close-in view of mesh inside the transverse fracture and rings around the fracture in the reservoir mesh.

METHOD AND SYSTEM FOR MODELING AND PREDICTING HYDRAULIC FRACTURE PERFORMANCE IN HYDROCARBON RESERVOIRS

CROSS-REFERENCE TO RELATED APPLICATIONS

The present application claims priority from U.S. Provisional Patent Application No. 60/851,465, filed Oct. 13, 2006, entitled "METHOD AND SYSTEM FOR REPRESENTING RESERVOIR SYSTEMS," naming inventor Stephen R. Kennon, which application is incorporated by reference herein in its entirety, and U.S. Provisional Patent Application No. 60/854,381, filed Oct. 25, 2006, entitled "METHOD AND SYSTEM FOR REPRESENTING RESERVOIR SYSTEMS," naming inventor Stephen R. Kennon, which application is incorporated by reference herein in its entirety.

FIELD OF THE DISCLOSURE

The present disclosure is generally related to modeling and predicting hydraulic fracture performance in hydrocarbon reservoirs.

BACKGROUND

Oil and gas reservoirs are produced by drilling wells of vertical, deviated or horizontal orientation, cementing and perforating the casing, installing tubing and connecting the tubing to a pipeline. In many formations, large increases in productivity can be achieved by stimulating production through reduction of local flow resistance near the well. In particular, hydraulic fracture stimulation involves pumping high pressure fluids (water and propant) into the formation through the casing perforations to fracture the rock and thereby lead to high conductivity paths for the oil and gas to flow along into the well. As oil and gas become increasingly hard to find, are produced from less economical formations, and with the high cost of creating hydraulic fractures, it is imperative for operators to predict the performance of these fractures for both horizontal and vertical wells. It is very difficult to know the extent of fractures and their productivity, since seismic data is quite inaccurate at the depths typically incurred today.

In the existing operating environment, making quick decisions about hydraulic fracture design (i.e. size of job, pounds of sand to pump, type of sand, etc.) is a necessity. Especially in low permeability rock, fracture quality and design are critical to success on these projects. The value of planning in areas of prospect identification, field development, and facilities design has been well documented. The value of planning and optimization for completion design is no different. However, planning based on quantitative modeling is rarely done at this stage. How is the desired half length determined? Although it should be based on optimized production per unit of cost, fracture design is based primarily on the last job done in the area of interest.

Due to the extreme importance of a well-performing hydraulic fracture, recent industry efforts have been focused on trying to model hydraulic fractures. However, the majority of this effort has been accomplished using traditional reservoir simulators with some form of local grid refinement. This grid refinement exercise is done because industry experts recognize the importance of capturing the most resolute picture of fluid flow around the hydraulic fracture as possible. Unfortunately, this grid refinement, by and large, takes a significant amount of time and expertise due to the tools available. Furthermore, the resolution is still not fine enough. In addition, it does not allow the time needed to perform an analysis for common operational environments that exist in low perm areas. Analysis using existing simulators cannot be executed quickly enough to be able to be inserted into the process of well stimulation design and drilling optimization plans.

There is no doubt that the process of finding (acreage position, data acquisition, seismic interpretation, mapping, drilling locations, economics and risk analysis) and developing (exploratory drilling, facilities, infill drilling) oil and gas properties is expensive. Understanding how a hydraulic fracture improves production performance is important to enable optimal completion and field development strategy. To truly understand fracture performance, understanding of reservoir performance is a must.

SUMMARY

A new approach to predicting the performance of hydraulic fracturing through a revolutionary numerical model embedded in the process of drilling, stimulating and developing new wells and fields is provided.

A particular embodiment includes a software system which takes input from various data sensors and displays or records results of the processing of the data inputs. In particular, the input data includes a description of the geometry and geology of a hydrocarbon reservoir and its wells, and any existing production data for that field. This input is processed automatically to produce an unstructured Finite Element Mesh filling the region between the sand-face of each well bore and the outer boundary of the reservoir (FIG. 1). For each hydraulic fracture, the interior and exterior of the fracture is automatically filled with an unstructured mesh, said mesh is smoothly graded to fit into the overall reservoir grid (FIG. 2). Fracture properties are assigned within the fracture (such as permeability and porosity) which encompasses the higher flow rates inside the fracture (FIG. 3). Flow inside the fracture is passed into the well bore through finite elements connected directly to the well bore boundary (its "sand-face") (FIG. 4). The flow inside the well bore is accumulated along the well centerline (FIG. 5) which follows the input data well trajectory information from a trajectory tracking device. The flow is finally compared to the total flow coming from the well as measured by a flow measuring device at the surface (FIG. 6). If the flow is different from what has been measured, the system displays the difference and the user modifies the reservoir and fracture model geometry and properties to force agreement with measured data. At each stage of the flow analysis, the steps are automatically executed to produce the mesh and the flow field solution variables at each node of the unstructured finite element mesh.

A particular embodiment provides a new set of computer-based algorithms and systematic modeling processes for numerical simulation and modeling of Hydraulic Fractures in a hydrocarbon reservoir, with the intent of improving well performance, profitability, and recoverable hydrocarbons extracted from oil and gas reservoirs. The new techniques accurately capture all regimes of multi-phase fluid flow from transient to steady-state for both vertical and horizontal wells, and more realistically and accurately represent the mechanics of flow than previous models. The formulation and implementation of the new techniques allows for rapid-iteration modeling of a reservoir with different fracture characteristics in the reservoir and the well-completions, thereby allowing operators to optimize their fracture designs based on local well and reservoir properties and conditions. The unstructured mesh used to model the fracture is generated automatically, using algorithms that orient and structure the mesh to best capture the flow field around the fracture and well bore. The meshing models are further integrated into a novel finite element computational model that has been specially formulated for modeling hydrocarbon multi-phase fluid flow in porous media (rock).

The new modeling system is used as an integral part of the process of stimulating well production by hydraulic fractures in vertical, horizontal and deviated wells. The software system is provided with a geological description of the reservoir (sometimes several alternative descriptions based on uncertainties), and in the case of a previously completed well, inputs from data sensors measuring fluid flow and pressure, fracture orientation, length, and spacing, well bore trajectory data, rock and fluid types and data. In the case of an uncompleted well, planned trajectories and fracture parameters are provided along with rock and fluid properties. The software computes and outputs a model of fluid flow in the reservoir and the fractures based on these inputs. This model is used to: display and record the performance of said fracture stimulations, compare sensitivities in production response to different fracture and reservoir parameters, assist in the design (optimize fracture length and orientation) of the fracture in uncompleted wells, detect degradation of performance over time for previously fractured wells, and analyze refracturing effects on existing fractured wells. The models are used to drive the process of producing the next fracture on an existing well, or the next well drilled, or the next field drilled by the operator, by computing then displaying and recording the performance of new fractures. The output of the model is also used as input to economic models for driving the economic optimization process for drilling and fracture-stimulating new wells. The system produces accurate models that surpass the abilities of prior art in processing the complex information including geology, petrophysical and geometry information and producing displays and records that are usable by other processes to optimize the value of the oilfield asset.

A particular embodiment uses an unstructured automatic mesh and a finite element numerical method to model a reservoir, wells, and completions as a single system, accounting for static information and transient behavior of wells, fractures and reservoirs in a single model. This yields earlier understanding of well and fracture performance. Discerning reservoir performance versus hydraulic fracture performance is a key to this approach. More specifically, operators and service companies can optimize the number of fractures, hydraulic fracture spacing, orientation and half length size required for economics analysis and optimal production. This method supports vertical, deviated and horizontal wells, and can be applied to analyzing both fracture performance for existing wells and fracture design for new (uncompleted) wells.

A particular embodiment includes a new module in the Resolve product from Object Reservoir Inc. Resolve product includes a set of software instructions executed on a workstation with a display and recording hardware to allow input data of reservoir and well geometry and geology to be automatically discretized to form a Finite Element Mesh. Further input data including fluid and rock properties is processed along with information from well logs and seismic interpretations to produce a fluid flow analysis and display of said analysis. The results of the display and recorded data are used in downstream processes for determining optimal well design and placement and for evaluating reservoir reserves and recoverables. Certain features related to the Resolve product are described in U.S. Pat. Nos. 6,633,837; 6,674,432; 6,941,255; 7,043,413; 7,006,951; 7,027,964; 7,149,671; 7,260,508; and copending U.S. patent application Ser. No. 11/187,600, each of which is incorporated herein by reference in its entirety.

Resolve with Fracture Meshing and Flow Modeling Module is a new software that when executed on the CPU of a workstation will (a) take input data derived from various data sensors and records that represent a reservoir and its wells geometry and geology (b) and produce an automatic mesh of the reservoir, wells and their hydraulic fractures and (c) produce a set of solution variables representing the fluid flow field on the mesh using the Finite Element Method and (d) compare the results with measured data to conform the model to the data such as to produce a characterization of the reservoir and fracture properties sufficient to use for making decisions on further reservoir, well and field development. Existing simulators utilize a proxy for modeling fractures, because they are unable to mesh and model the fracture at the actual scale of the fractures in the field, due to limitations in the scale ranges of their formulations. These proxies model fractures at widths of feet, and adjust the fracture perm in the model to offset the unrealistic width. This existing approach cannot capture the actual dynamics of transient flow of the fracture, and only provides a steady state approximation to real flows. Field experience has shown that real-world fractures flow fluids at widths of less than ⅛ of an inch, and fractures are created in the rock at even smaller scales. This patent application describes a technique that accurately meshes and models fractures with the actual dimensions of the fracture, thereby capturing all modes of fluid flow from early transient flow through steady state flow. Capturing this dynamic of fluid flow in the fracture is essential for accurately assessing the effectiveness of fractures, particularly in low permeability reservoirs where much of current oil and gas exploration is focused.

Resolve with Fracture Meshing and Flow Modeling Module furthermore (a) takes input data from various data sensors and records that represent a reservoir's geometry and geology (b) takes input data from trajectory measuring devices to provide well bore trajectory information (c) takes input data from well log records to inform locations of perforations and completions (d) takes input data from measuring apparatus of amounts of sand, water and propant pumped to determine ranges of fracture half lengths and conductivities and (e) takes input data on fluid and rock properties from laboratory experimental apparatus and records of such to produce (f) a model of the reservoir with its wells and hydraulic fractures that faithfully reproduces the measured production data of the field.

A further feature of the Fracture Meshing and Flow Modeling Module includes steps that (a) take input data from various sources for reservoir, vertical well and fracture geometry and geology, (b) take specification from a user through an input hardware device specifying a desired boundary around the fracture into which a semi-structured mesh is created automatically, (c) impose a semi-structured mesh inside the fractured portion of the reservoir to allow for accurate flow modeling inside the fracture, with the fracture modeled by a plurality of finite elements of the same width and shape as the actual physical fracture width, and smoothly coupling this fracture mesh with the reservoir mesh and the well bore mesh, (d) produce a fluid flow analysis and solution variables representing the fracture and reservoir flow and (e) visualize and record the solution.

Another feature of the Fracture Meshing and Flow Modeling Module includes steps that (a) take input data from various devices that measure and estimate the reservoir, horizontal well and parallel or transverse fracture geometry and geology, (b) take specification from a user through an input hardware device specifying a desired mesh spacing around the fracture and the number of "rings" of a semi-structured mesh is created automatically, (c) impose a semi-structured mesh inside the fractured portion of the reservoir to allow for flow modeling inside the fracture with the fracture modeled by a plurality of finite elements of the same width and shape as the actual physical fracture width and smoothly coupling this fracture mesh with the reservoir mesh and the well bore mesh and (d) produce a fluid flow analysis and solution variables representing the fracture and reservoir flow and (e) display and record the solution.

The Fluid Flow Model produces a solution for display and recording by constructing a nonlinear system of equations representative of the flow in the reservoir and into the fracture. This nonlinear system comes from discretization of the partial differential equations governing flow in porous media based on Darcy's law. Discretization is accomplished using a finite element method as described in U.S. Pat. Nos. 6,633,837; 6,674,432; 6,941,255; 7,043,413; 7,006,951; 7,027,964; 7,149,671; 7,260,508; and copending U.S. patent application Ser. No. 11/187,600, each of which is incorporated herein by reference in its entirety.

BRIEF DESCRIPTION OF THE DRAWINGS

The following is a brief description of the figures.

FIG. 1: Schematic of reservoir, well and hydraulic fracture showing location of Finite Element Mesh with wells in cross-section showing tubing flow to the surface and surface facilities and processing followed by pipeline connections, and for a reservoir with both vertical and horizontal fractured wells.

FIG. 2a: Schematic of mesh filling the interior of the fracture in a cross section view of a single transverse fracture of a horizontal well.

FIG. 2a-1 shows the mesh for a vertical well symbolic of FIG. 11

FIG. 2a-2 shows the mesh for a horizontal well transverse fracture symbolic of FIG. 12.

FIG. 3: Schematic of properties of fracture propant.

FIG. 4: Flow into the fracture, along the fracture and into the wellbore through finite element connections.

FIG. 5: Flow along the wellbore centerline finite element connections up the tubing and to the surface.

FIG. 6: Measurement of flow and pressure at the surface.

FIG. 7 shows a reservoir with wells drilled from a top (areal) view.

FIG. 8a shows fluids produced to the surface are transported by pipeline.

FIG. 8b shows a reservoir with a well in cross-section showing tubing flow to the surface and surface facilities and processing followed by pipeline connections.

FIG. 9 shows the process of pumping hydraulic fracturing fluids to produce fracture stimulation.

FIG. 10 shows a near-well area with a fracture stimulation treatment ongoing through the pumping of fluids and propant into the formation through the perforations.

FIG. 11 shows the areal extent of a hydraulic fracture for a vertical well.

FIG. 12 shows the areal extent of a plurality of hydraulic fractures transverse to the trajectory of a horizontal well.

FIG. 13 shows the near-well region specified by the user for a vertical fractured well.

FIG. 14 shows the mesh in the near-well region for FIG. 13.

FIG. 15 shows the near-well region with rings and mesh spacing specified by the user for a horizontal well with transverse fractures.

FIGS. 16-17 show the process of field data acquisition for well logs, seismic data, wellbore trajectory, fluid properties and rock properties.

FIG. 18a -18d show process of inputting data from FIG. 13-19 into Resolve.

FIG. 19 shows automatic mesh generation in Resolve.

FIG. 20 shows output results from Resolve on a display and recording device.

FIG. 21 shows radial near-well mesh smoothly embedded in unstructured reservoir mesh for a vertical well and a horizontal well.

FIG. 22 shows a horizontal well with transverse hydraulic fractures showing finite element meshing.

FIG. 23 shows a close-in view of mesh inside the transverse fracture and rings around the fracture in the reservoir mesh.

DETAILED DESCRIPTION OF THE DRAWINGS

The following describes the details of the Fracture Flow Modeling Module (FFMM) of the Resolve software first by over viewing the processes of drilling and fracturing wells. Next, the meshing of the various different geometries of a reservoir with fractured wells is shown.

Hydrocarbon reservoirs are produced by drilling wells vertically then completing them by cementing and perforation. Horizontal wells are produced similarly, but at depth, the borehole is turned by special drill bit equipment to make the wellbore horizontal 702 (FIG. 7). Reservoir fluids (oil, gas, water) are produced to the surface facilities 102 as shown in FIG. 1. The surface facilities 102 are connected to pipelines 104 and the fluids are refined to produce petroleum products (FIG. 1).

In tight rock reservoirs (reservoirs with very low permeability, and thus high resistance to fluid flow), the well completions are stimulated by hydraulic fracturing (FIG. 9). This process introduces cracks 902 in the rock 904 near the well 906 which increases flow surface area and decreases overall resistance to flow, thus increasing hydrocarbon production. FIG. 10 shows this process for a typical reservoir 1002 and well 1004. FIG. 11 shows the areal extent of a hydraulic fracture 1102 from a vertical well 1104. This fracture system consists of a crack a few millimeters wide and several hundreds of meters long. It is impossible to accurately model the benefit of the fracture treatment without adequately discretizing the complex, dynamic-scale range geometry and topology of the fracture system. Any successful model should discretize the fracture system as it is in reality. For horizontal wells 1202, multiple transverse fractures 1204 are created by stimulation treatments (FIG. 12). The fractures are typically formed along lines of rock stress in the reservoir. Thus, the fracture model handling fractures that intersect the well bore at an angle (not necessarily 90 degrees), and different transverse fractures along a well bore may intersect the well bore at different angles due to stress variation across the reservoir, deviation of the well bore due to changes in drilling trajectories, or re-fracturing after partial depletion (that changes the rock stresses) that results in variations of the fracture angles. The technique described in this application incorporates the modeling of all of the aforementioned variations of fracture and well bore intersection at arbitrary angles, that vary for different fractures on the same well bore.

For horizontal transverse fractures 202, or vertical wells 204 with fracture 206, FIG. 2a shows the cross-section of said fracture 202 and 206, and show how it is filled with a finite element mesh 208 for vertical and horizontal wells.

FIG. 1 shows a reservoir mesh 106 and hydraulic fracture mesh for a reservoir with both vertical 108 and horizontal 110 fractured wells. The mesh is smoothly graded to be the correct size to properly represent the local flow dynamics. The domain of the reservoir 112, hydraulic fracture, and near-well is filled with tetrahedral or prismatic finite elements. The boundary surfaces of the domain, including surfaces defining the reservoir boundary 114, fracture boundary, wellbore boundary and any other features such as faults, are discretized by triangular or quadrilateral finite elements that are faces of the volume tetrahedral or prismatic elements (see FIG. 1).

We now discuss further details of mesh generation as guided by the workstation operator and a hardware input device. FIG. 13 shows the near-well region 1302 specified by the user for a vertical fractured well 1304. This near-well region 1302 is elliptically shaped, which is optimal based on analytic theory for near-well fracture flow. The extent of the near-well region is controlled by the user. FIG. 14 shows the mesh 1402 in the near-well region 1404 for FIG. 13. FIG. 15 shows the near-well region 1502 with rings 1504 and mesh spacing specified by the user for a horizontal well 1506 with transverse fractures 1508.

Now the process of data acquisition by various sensors is described to provide background on the input data for the FFMM module of Resolve; followed by details of the flow of data within FFMM and output display and recording. Also, we describe the use of output data as an integral input to other processes for decision support and field development planning.

FIGS. 16 & 17 show the process of field data acquisition for well logs, seismic data, wellbore trajectory, fluid properties and rock properties. This data is processed into the FFMM module of Resolve as shown in FIGS. 18a-d. The data is input by the user on a hardware input device (computer workstation with mouse and keyboard and monitor). Direct input from files outputted by the field data acquisition is also available. Once the model is developed by the workstation user, the model is run and iteratively modified by the user or by an optimization algorithm to closely match the observed performance of the reservoir. From this model, forecasts are made for how the reservoir will produce in the future.

Next we describe the common occurrence of re-acquisition of data and the situation where data has an associated uncertainty range. The impact of new or range-type data on the workflow of the workstation operator and downstream decision support processes is indicated. As the production of hydrocarbons occurs from the reservoir, continual measurements are made of the pressure and rates fluid components. These pressures and rates are compared to the model's forecast as described in the previous paragraph. If there is a significant difference in model prediction versus newly acquired data, the model is re-calibrated as discussed in previous paragraph.

The following describes the details of the Fracture Flow Modeling Module of the Resolve software by the following subsystems: (a) Flow Calculation Model based on the Finite Element Method, (b) flow within the fracture model, (c) the automatic meshing of the reservoir well and fractures, (d) the assigning of properties to the reservoir, and fracture elements (e) the solution calculation, (f) the display and recording of results, (e) the further processing of results by downstream processes for decision support and field development.

Flow Calculation Model

The finite element method has a distinct advantage over other modeling techniques. It enables accurate calculations on general unstructured meshes to model the complex geometry of unconventional completions. Reservoir geometry includes geologic layers one to tens of feet thick by thousands of feet in areal extent. This high ratio of areal extent to thickness provides a challenging meshing problem. It becomes evident that reservoir geometries are described most accurately by areal discretizations that are extruded through the thickness. However, the wellbore has cylindrical geometry that must be integrated into the reservoir's high aspect ratio layered system. The near-well flow field is radial or elliptical. Accurate flow modeling may use a radial/elliptic mesh. To marry these disparate requirements, two different meshes with different spatial scales and local geometries can be used. A full 3D mesh is desireable. In fact, the scales and mesh shapes should grade smoothly from near-well to reservoir. We achieve this by unstructured areal meshing that recognizes the presence of the wellbore trace and matches the near-well mesh (see FIG. 21) with the vertical or horizontal well radial mesh, which smoothly integrates into the reservoir mesh.

Transverse fractures are introduced by further modifying the areal mesh to incorporate the trace of the fracture on the horizons of the layer (see FIG. 21 and 22).

Tight rock formations can be modeled using fine near-well meshing. See the structured radial near-well mesh 2202 shown in FIG. 22. Additional resolution is desirable areally to catch the transient progression of pressure. To do this, rings 2204 are introduced around the wellbore trace and around each fracture (see FIG. 22 and 23). Notice that the fractures are resolved down to the actual assumed physical width.

This type of unstructured mesh allows arbitrary variation of horizontal well trajectory (in 3D), fracture orientation, fracture spacing, and fracture properties, such as width and extent. Asymmetric fracturing can be managed by specifying differing lengths on each left/right leg of the fracture. Fracture properties, such as permeability and porosity, are specified and can be degraded away from the well. This is important in many situations because this is physically correct behavior. Also, it is useful in matching influence effects of nearby wells.

Fracture Flow

Flow inside the fracture is modeled by Darcy flow with high permeability. Mesh elements are created inside the fracture so pressure and saturation are computed at the nodes 2302 (see FIG. 23). This provides complete continuity of pressure and saturation at the interface between completion and reservoir. Fluid flux is introduced as a new computed quantity at the completion/reservoir interface. The flux is implicitly computed and is more accurate than a simple derivative calculation. Each fluid phase flux is calculated at the reservoir/completion interface. Then, it is summed to the wellbore centerline and integrated up the wellbore to compute the total rate. Pressure drop along the centerline is calculated according to hydrostatic or a simple frictional flow model. Rate or bottom-hole pressure constraints are applied at the top of the completion to complete the system.

Multiphase flow in the fracture normally leads to numerical difficulties. Very high permeability and small element sizing cause these difficulties. Generally, small time-steps are needed to capture local flow dynamics in the fracture. For this reason, a mixing model overcomes these difficulties. The basic idea is to assume that fluid phases mix rapidly in the fracture due to the high permeability. This means that the distribution of saturations in the fracture varies smoothly in space and in time. The model uses a diffusion term inside the fracture that only applies to the saturations. This term has no effect on the pressure, and subsequently, no effect on mass conservation and overall flow dynamics.

Advantages

Simultaneously modeling fracture geometry while computing flow in the fracture is a unique capability. Accurately modeling the drainage patterns and determining economic viability of these unconventional completions surpasses other attempts made using conventional simulators. The simulations suffered from inflexibility and untenable use of computational resources. In contrast, the Finite Element approach used here enables near-well field computation and smoothly integrates this flow with the overall reservoir dynamics.

The meshes are created automatically, so users can change and rerun a case quickly and interactively. This very quick round-trip engineering results in the ability to design an optimal development and exploitation plan by testing the impact of more fractures on existing wells vs. drilling new wells in the same reservoir. Traditional methods are not flexible enough to allow more than one or two scenarios within a given time and resource budget. The breakthrough technology discussed herein provides the operator with a unique tool for development and planning decisions.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A computer program product comprising a computer readable storage medium comprising instructions that, when executed by a computer, cause the computer to generate a representation, the instructions comprising:
   instructions for generating an unstructured mesh including at least one mesh element surrounding a representation of a fracture, wherein the representation of the fracture accurately represents a physical transverse fracture down to a physical scale, wherein the unstructured mesh is automatically generated and integrated with both a reservoir mesh and a well bore mesh; and
   instructions for generating a plurality of mesh rings around the representation of the fracture to accurately capture transient behaviors, wherein a number and spacing of the mesh rings is controlled automatically based on specification from a user through an input hardware device specifying a desired mesh spacing around the representation of the fracture.

2. The computer program product of claim 1, wherein a well bore corresponding to the well bore mesh and the fracture connect and intersect at arbitrary angles.

3. The computer program product of claim 1, wherein the unstructured mesh corresponds to physical fractures with unequal fracture lengths on either side of a well bore corresponding to the well bore mesh.

4. The computer program product of claim 1, wherein the representation further comprises a fine mesh pattern refined for a region of interest to capture geometry of a reservoir corresponding to the reservoir mesh, at least one well corresponding to the well bore mesh and the fracture.

5. The computer program product of claim 1, wherein the representation further comprises data to display graphical images related to the unstructured mesh on a display device.

6. A method comprising:
   iteratively analyzing at least one fracture in a hydrocarbon reservoir by modeling the hydrocarbon reservoir to account for static information and transient behavior of the at least one fracture and the hydrocarbon reservoir; and
   enhancing development of an oil field based on the analysis of the at least one fracture,
   wherein iteratively analyzing the at least one fracture comprises generating a semi-structured mesh corresponding to a fractured portion of the hydrocarbon reservoir to flow model the fractured portion, wherein the fractured portion is modeled by a plurality of finite elements having a width and shape corresponding to physical fracture width, and wherein the semi-structured mesh is smoothly coupled with a reservoir mesh and a well bore mesh.

7. The method of claim 6, wherein enhancing development of the oil field includes improving economics related to the oil field.

8. The method of claim 6, wherein enhancing development of the oil field includes improving drilling patterns related to the oil field.

9. The method of claim 6, wherein iteratively analyzing the at least one fracture further comprises receiving input data derived from various data sensors and records that represent geometry and geology related to the hydrocarbon reservoir and at least one well, and automatically producing a mesh of the hydrocarbon reservoir and the at least one well.

10. The method of claim 9, wherein the input data comprises at least one of reservoir boundaries, well bore trajectory, well logs, fracture measurements, proppant characteristics, rock properties and fluid properties.

11. The method of claim 6, wherein iteratively analyzing the at least one fracture further comprises automatically producing a set of solution variables representing a fluid flow field on a mesh using a finite element method, and producing a fluid flow analysis and solution variables representing flow related to the at least one fracture and the hydrocarbon reservoir.

12. The method of claim 11, wherein iteratively analyzing the at least one fracture comprises displaying and recording data related to the fluid flow analysis and the solution variables.

13. The method of claim 6, wherein iteratively analyzing the at least one fracture comprises iterating a model to optimize against different options related to well design or completions.

* * * * *